United States Patent
Takeshita

(10) Patent No.: US 6,850,100 B2
(45) Date of Patent: Feb. 1, 2005

(54) OUTPUT BUFFER CIRCUIT

(75) Inventor: Koji Takeshita, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/342,239

(22) Filed: Jan. 15, 2003

(65) Prior Publication Data

US 2003/0132788 A1 Jul. 17, 2003

(30) Foreign Application Priority Data

Jan. 17, 2002 (JP) .................................. 2002-008779

(51) Int. Cl.$^7$ ............................................. H03K 3/00
(52) U.S. Cl. ..................................... 327/112; 327/437
(58) Field of Search ........................ 327/108–112, 309, 327/312, 316, 323, 332, 436, 437

(56) References Cited

U.S. PATENT DOCUMENTS 6,400,192 B2 * 6/2002 Boezen et al. ............... 327/112

OTHER PUBLICATIONS

"Design Guide for a Low Speed Buffer For The Universal Serial Bus", Intel Corporation, Revision 1.1, Dec. 1996, pp. 1–11.

* cited by examiner

Primary Examiner—Kenneth B. Wells
(74) Attorney, Agent, or Firm—Volentine Francos & Whitt, PLLC

(57) ABSTRACT

An output buffer circuit of the invention comprises a first output transistor connected between a power supply potential node and an output node, a second output transistor connected between a ground potential node and the output node, a first control circuit for controlling a conductive state of the first output transistor, a first clamp circuit for supplying a given potential to a first node to which the first control circuit is connected, a control circuit for controlling a conductive state of the second output transistor, and a second clamp circuit for supplying a given potential to a second node to which the second control circuit is connected. The first clamp circuit supplies a given potential to the first node when the first control circuit is inactivated, and stops the supply of the given potential when the first control circuit is activated. The second clamp circuit supplies a given potential to the second node when the second control circuit is inactivated, and stops the supply of the given potential when the second control circuit is activated.

20 Claims, 18 Drawing Sheets

OUTPUT BUFFER CIRCUIT

BACKGROUND OF THE INVENTION

1. Field of the Invention

The present invention relates to an edge rate control type output buffer circuit.

2. Description of the Related Art

An output buffer circuit has been described in a literature entitled "Design Guide For A Low Speed Buffer For The Universal Serial Bus" Revision 1.1 December 1996 by Intel Corporation as a conventional edge rate control type output buffer circuit. The conventional output buffer circuit is a CMOS output buffer circuit that is used as a buffer circuit of a USB (Universal Serial Bus).

This conventional output buffer circuit has a PMOS transistor and an NMOS transistor, connected to an output pad, respectively, as an output transistor. The PMOS transistor is controlled in a conductive state by an amplifier. The NMOS transistor is controlled in a conductive state by an amplifier that is different from the amplifier for controlling the PMOS transistor. These two amplifiers are controlled in operation respectively, in response to an enable signal. Inverted input terminals of these two amplifiers are connected to a bias circuit, respectively, and a given bias potential is supplied to these amplifiers. Non-inverted input terminals of these two amplifiers are commonly connected to each other. The common connection node is connected to a clamp circuit and a given potential is always supplied to the common connection node. A feedback capacitor element is connected between the common connection node and an output pad. The conventional output buffer circuit having the foregoing structure controls a throughput rate of an output waveform at the rising edge and the throughput rate of the output waveform at the falling edge (hereinafter referred to simply as rising edge rate and falling edge rate).

However, there is a case where the conventional output buffer circuit can not satisfy an AC standard of a USB, particularly, VCRS (crossover voltage) standard owing to change of operational environment such as variation of a power supply potential, change of an operational temperature or the like. There are following two reasons. One reason is that there occurs distortion in an output waveform because a given bias potential is always supplied to a common node. The second reason is that there occurs a distortion in an output waveform owing to influence of current which flows into through a pull-up resistor in the case where the conventional output buffer circuit is used as a low speed buffer of the USB.

SUMMARY OF THE INVENTION

It is an object of the invention to provide an output buffer circuit capable of realizing interface which outputs waveforms having a given edge rate even if an operational environment is changed.

To achieve the above object, the output buffer circuit of the invention comprises a first output transistor connected between a power supply potential node and an output node, a second output transistor connected between a ground potential node and the output node, a first control circuit for controlling a conductive state of the first output transistor, a first clamp circuit for supplying a given potential to a first node to which the first control circuit is connected, a second control circuit for controlling a conductive state of the second output transistor, and a second clamp circuit for supplying a given potential to a second node to which the second control circuit is connected.

The first clamp circuit supplies a given potential to the first node when the first control circuit is inactivated, and stops the supply of the given potential when the first control circuit is activated.

The second clamp circuit supplies a given potential to the second node when the second control circuit is inactivated, and stops the supply of the given potential when the second control circuit is activated.

PREFERRED EMBODIMENT OF THE INVENTION

First Preferred Embodiment

Figure 1:
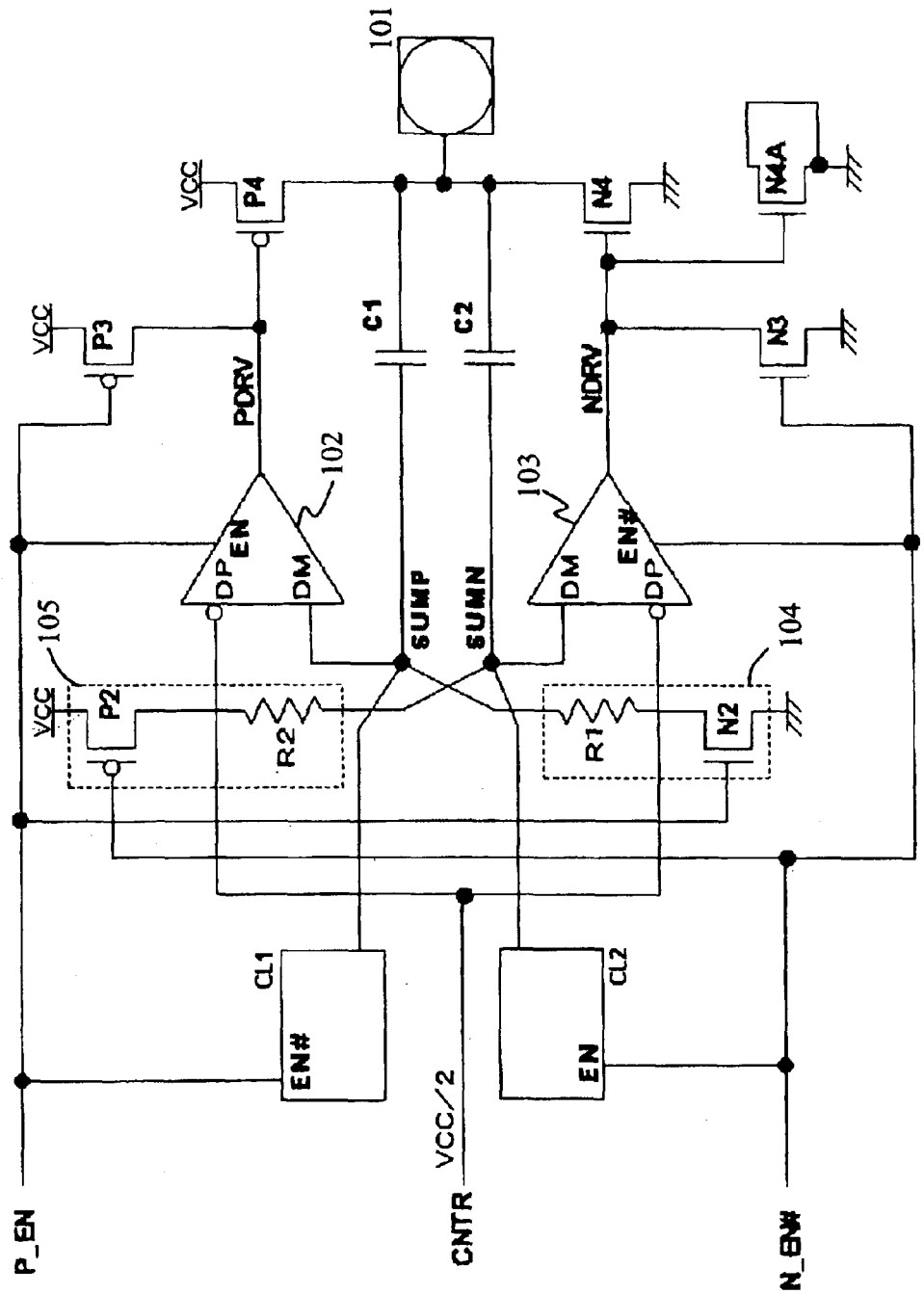
FIG. 1 is a circuit diagram showing the structure of an output buffer circuit according to a first embodiment of the invention.

A first embodiment of the invention is now described. FIG. 1 is a circuit diagram of an output buffer circuit according to the first embodiment of the invention. The output buffer circuit of the first embodiment comprises an output node 101, a first output transistor P4 (hereinafter referred to as output transistor P4) and a second output transistor N4 (hereinafter referred to as output transistor N4), a first control circuit 102 for controlling a conductive state of the output transistor P4 (i.e., the amount of current which flows from a power supply potential node to the output node 101 through the output transistor P4), a second control circuit 103 for controlling a conductive state of the output transistor N4 (i.e., the amount of current which flows from the output node 101 to a ground potential node through the output transistor N4), a first capacitor element C1 (hereinafter referred to as capacitor element C1) for controlling a rising edge rate, a second capacitor element C2 (hereinafter referred to as capacitor element C2) for controlling the falling edge rate, a first current source 104 (hereinafter referred to as current source 104) connected between a first node (node SUMP) and the ground potential node, a second current source 105 (hereinafter referred to as current source 105) connected between a second node (node SUMN) and the power supply potential node, a first clamp circuit CL1 (hereinafter referred to as clamp circuit CL1) for supplying a given potential to the node SUMP, a second clamp circuit CL2 (hereinafter referred to as clamp circuit CL2) for supplying a given potential to the node SUMN, a switch element P3 for connecting between a node PDRV and the power supply potential node when the first control circuit 102 is in "inactive state", and a switch element N3 for connecting between a node NDRV and the ground potential node when the second control circuit 103 is in "inactive state".

The output transistor P4 is made up of a P-channel MOS transistor (hereinafter referred to as PMOS transistor) comprising a source (first electrode) connected to a power supply potential node to which a power supply potential VCC is supplied, a drain (second electrode) connected to the output node 101, and a gate (control electrode) connected to the first control circuit 102. The output transistor N4 is made up of an N-channel MOS transistor (hereinafter referred to as NMOS transistor) comprising a source (first electrode) connected to a ground potential node to which a ground potential GND is supplied, a drain (second electrode) connected to the output node 101, and a gate (control electrode) connected to the second control circuit 103.

The first control circuit 102 is made up of an amplifier comprising an input terminal DM (first input terminal) connected to the node SUMP, an input terminal DP (second input terminal) to which a bias potential is supplied, an output terminal connected to the gate of the output transistor P4, and an enable terminal EN (control terminal) to which a first enable signal P_EN (first control signal) representing enable/disable of operation is applied. The bias potential to be supplied to the input terminal DP is one half of the power supply potential VCC (hereinafter represented by VCC/2). The first enable signal P_EN to be inputted to the enable terminal EN represents enable of operation of the first control circuit 102 at "H" (first logical level) while it represents disable of operation of the first control circuit 102 at "L" (second logical level). The first control circuit 102 is activated in response to the first enable signal P_EN of "H" while it is in inactivated in response to the first enable signal P_EN of "L". The first control circuit 102 is hereinafter referred to as amplifier 102.

Figure 2:
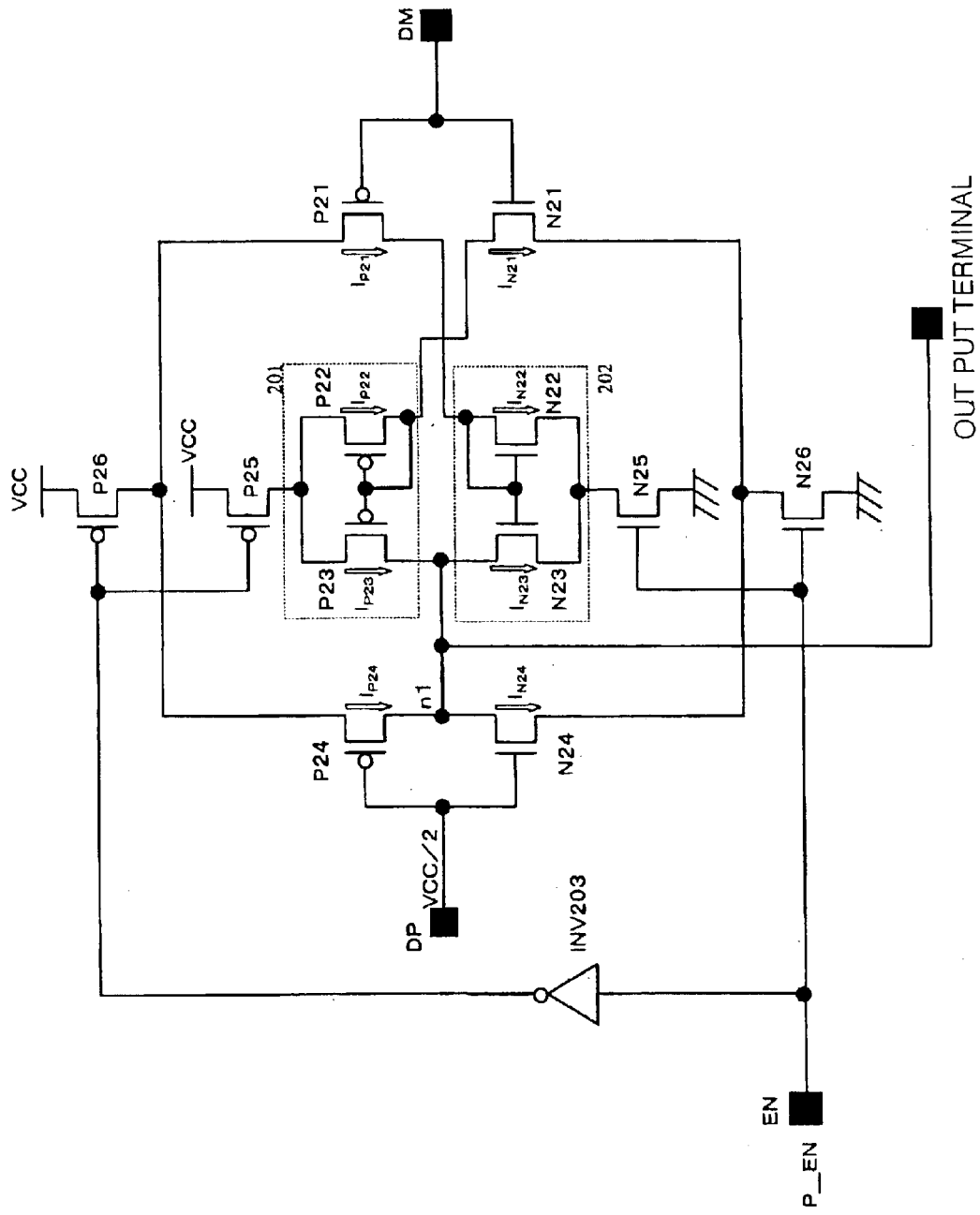
FIG. 2 is a circuit diagram showing the structure of an amplifier circuit 102.

The amplifier 102 is now described more in detail. FIG. 2 is a circuit diagram showing the structure of the amplifier 102. The amplifier 102 comprises a first current mirror circuit 201, a second current mirror circuit 202, a first input transistor N21 (hereinafter referred to as input transistor N21) that is connected between a current input side of the first current mirror circuit 201 and the ground potential node, a second input transistor P21 (hereinafter referred to as input transistor P21) that is connected between a current input side of the second current mirror circuit 202 and the power supply potential node, a first node (node n1) to which a current output side of the first current mirror circuit 201 and a current output side of the second current mirror circuit 202 are connected, a first resistor element P24 connected between the node n1 and the power supply potential node, a second resistor element N24 connected between the node n1 and the ground potential node, an inverter INV203, switch elements P25 and P26 operable in response to an inversion signal of the enable signal P_EN, and switch elements N25 and N26 operable in response to the enable signal P_EN.

The first current mirror circuit 201 comprises a PMOS transistor P22 and a PMOS transistor P23. The PMOS transistor P22 is the current input side of the first current mirror circuit 201. The PMOS transistor P23 is the current output side of the first current mirror circuit 201. A source of the PMOS transistor P22 is connected to the power supply potential node through the switch element P25, a drain thereof is connected to the input transistor N21, and a gate thereof is connected to a drain of a PMOS transistor P22 and a gate of the PMOS transistor P23. A source of the PMOS transistor P23 is connected to the power supply potential node through the switch element P25, a drain thereof is connected to the node n1, and a gate thereof is connected to the gate of the PMOS transistor P22.

The second current mirror circuit 202 comprises an NMOS transistor N22 and an NMOS transistor N23. The NMOS transistor N22 is the current input side of the second current mirror circuit 202. The NMOS transistor N23 is the current output side of the second current mirror circuit 202. A source of the NMOS transistor N22 is connected to the ground potential node though the switch element N25, a drain thereof is connected to the input transistor P21, and a gate thereof is connected to a drain of the NMOS transistor N22 and a gate of the NMOS transistor N23. A source of the NMOS transistor N23 is connected to the ground potential node through the switch element N25, a drain thereof is connected to the node n1, and a gate thereof is connected to the gate of the NMOS transistor N22.

The input transistor N21 is made up of an NMOS transistor. A source of the input transistor N21 is connected to the ground potential node through the switch element N26, and a drain thereof is connected to a drain of the PMOS transistor P22 forming the current input side of the first current mirror circuit 201, and a gate thereof is connected to the input terminal DM. The input transistor P21 is made up of a PMOS transistor. A source of the input transistor P21 is connected to the power supply potential node through the switch element P26, a drain there of is connected to a drain of the NMOS transistor N22 forming the current input side of the second current mirror circuit 202, and a gate thereof is connected to the input terminal DM.

The first resistor element P24 is made up of a PMOS transistor. The first resistor element P24 is hereinafter referred to as a transistor P24. A source of the transistor P24 is connected to the power supply potential node through the switch element P26, a drain thereof is connected to the node n1 and a gate thereof is connected to the input terminal DP. The second resistor element N24 is made up of an NMOS transistor. The second resistor element N24 is hereinafter referred to as a transistor N24. A source of the transistor N24 is connected to the ground potential node through the switch element N26, a drain thereof is connected to the node n1, and a gate thereof is connected to the input terminal DP. The bias potential VCC/2 is supplied to the input terminal DP.

Both the switch element P25 and switch element P26 are made up of a PMOS transistor, respectively, and they are controlled to turn ON or OFF in response to an inversion signal of the enable signal P_EN to be inputted to the enable terminal EN. Both the switch element N25 and switch element N26 are made up of an NMOS transistor, respectively, and they are controlled to turn ON or OFF in response to the enable signal P_EN. The node n1 is connected to the output terminal.

The second control circuit 103 is made up of an amplifier comprising an input terminal DM (first input terminal) connected to the node SUMN, an input terminal DP (second input terminal) to which a bias potential is supplied, an output terminal connected to a gate of the output transistor N4, and an enable terminal EN# (control terminal) to which a second enable signal N_EN# (second control signal) representing enable/disable of operation. The bias potential to be supplied to the input terminal DP is VCC/2. Further, the enable signal N_EN# to be inputted to the enable terminal EN# represents enable of operation at "L" (second logical level) while it represents disable of operation at time "H" (first logical level). The second control circuit 103 is activated in response to the enable signal N_EN# of "L" while it is inactivated in response to the enable signal N_EN# of "H". The second control circuit 103 is hereinafter referred to as an amplifier 103.

Figure 3:
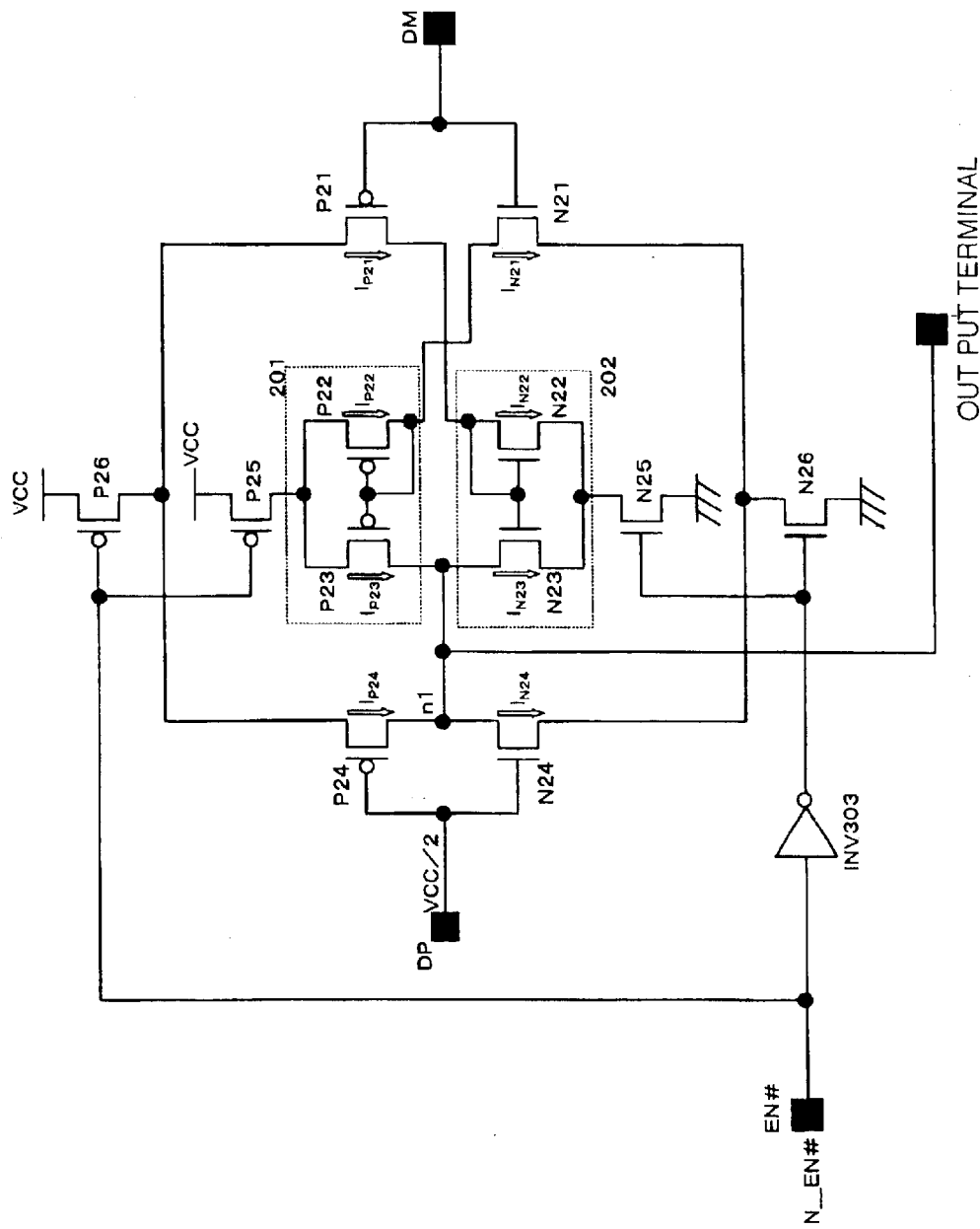
FIG. 3 is a circuit diagram showing the structure of an amplifier circuit 103.

The amplifier 103 is now described more in detail. FIG. 3 is circuit diagram showing the structure of the amplifier 103. The difference between the amplifier 103 and the amplifier 102 shown in FIG. 2 is that the enable signal N_EN# is inputted to a gate of a PMOS transistor forming the switch elements P25 and P26, and an inversion signal of the enable signal N_EN# is inputted to a gate of an NMOS transistor forming the switch elements N25 and N26. The other configuration of the amplifier 103 is the same as that of the amplifier 102.

The capacitor element C1 is connected between the output node 101 and the node SUMP. The capacitor element C2 is connected between the output node 101 and the node SUMN.

The current source 104 comprises a first resistor element (resistor means) R1 and a first switch element N2 which are serially connected to each other between the node SUMP and the ground potential node. The first resistor element R1 is connected between the node SUMP and the first switch element N2. The first resistor element R1 is made up of polycrystal silicon. The first switch element N2 is made up of an NMOS transistor comprising a source connected to the ground potential node, a drain connected to the first resistor element R1 and a gate to which the enable signal P_EN is inputted. A value of current flowing to the current source 104 is determined by a resistance of the first resistor element R1 and an ON resistance of the NMOS transistor forming the first switch element N2. The current source 104 is in "active state" in response to the enable signal P_EN of "H" (first logical level) to allow a given current to flow. The current source 104 is in "inactive state" in response to the enable signal P_EN of "L" (second logical level).

Figure 4:
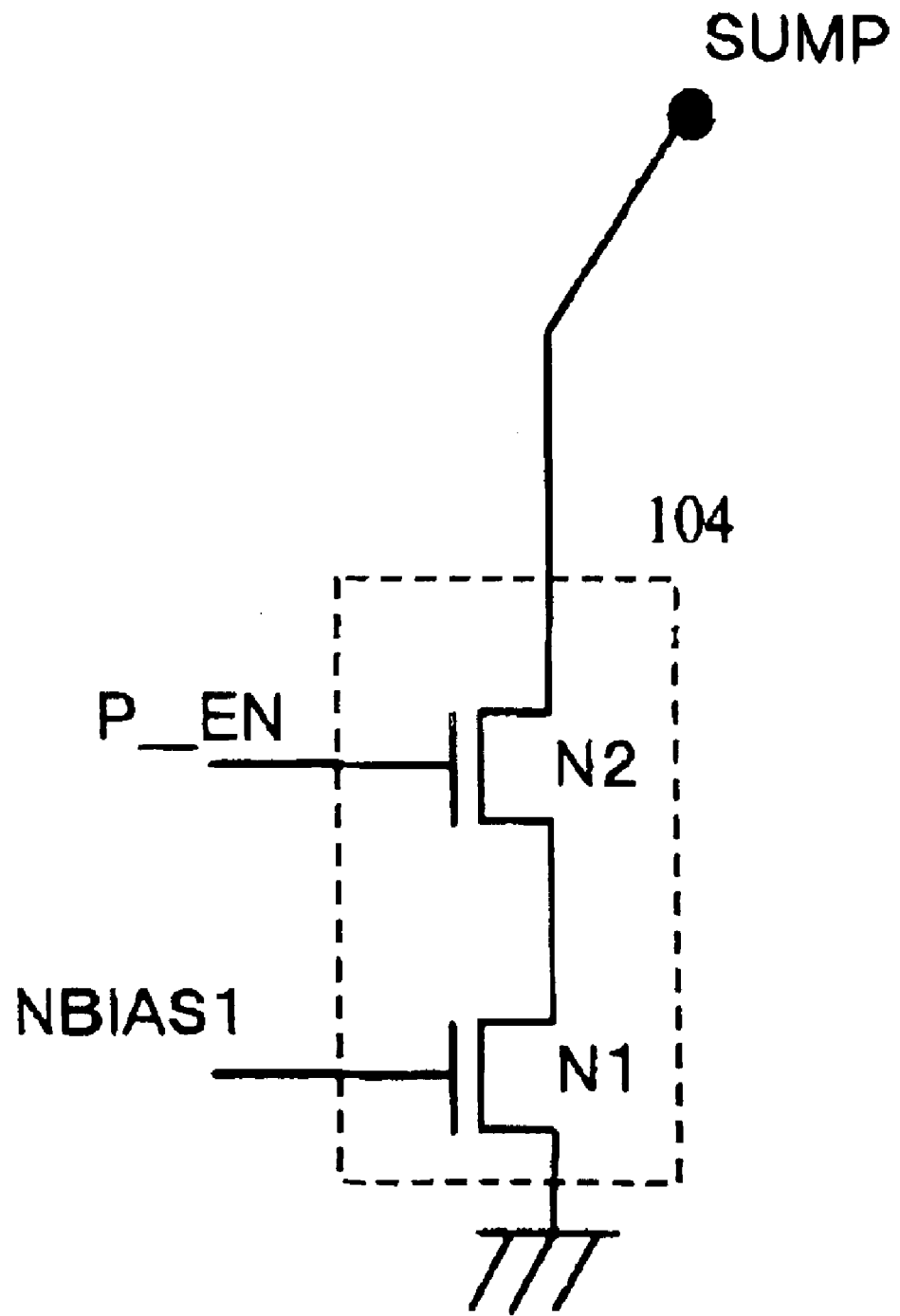
FIG. 4 is a circuit diagram showing another structure of a current source 104.

Another example of the current source 104 is illustrated in FIG. 4. FIG. 4 is a circuit diagram showing another structure of the current source 104. Another example of the current source 104 is made up of a first switch element N2 and a first resistor element N1 which are serially connected to each other between the node SUMP and the ground potential node. The first switch element N2 is made up of an NMOS transistor comprising a source connected to the first resistor element N1, a drain connected to the node SUMP and a gate to which the enable signal P_EN is inputted. The first resistor element N1 is made up of an NMOS transistor comprising a source connected to the ground potential node, a drain connected to a source of the NMOS transistor forming the first switch element N2 and a gate to which the bias potential NBIASI is supplied. A value of current flowing to the current source 104 is determined by an ON resistance of the NMOS transistor forming the first switch element N2 and an ON resistance of the NMOS transistor forming the first resistor element N 1.

The current source 105 is made up of a second switch element P2 and a second resistor element (resistor means) R2 which are serially connected to each other between the power supply potential node and the node SUMP. The second switch element P2 is made up of a PMOS transistor comprising a source connected to the power supply potential node, a drain connected to the second resistor element R2 and a gate to which the enable signal N_EN# is inputted. The second resistor element R2 is connected between a drain of a PMOS transistor forming the second switch element P2 and the node SUMP. The second resistor element R2 is made up of polycrystal silicon. A value of current flowing to the current source 105 is determined by an ON resistance of the NMOS transistor forming the second switch element N2 and a value of resistance of the second resistor element R2. The current source 105 is in "active state" in response to the enable signal N_EN# of "L" (second logical level) to allow a given current to flow. The current source 105 is in "inactive state" in response to the enable signal N_EN# of "H" (first logical level).

Figure 5:
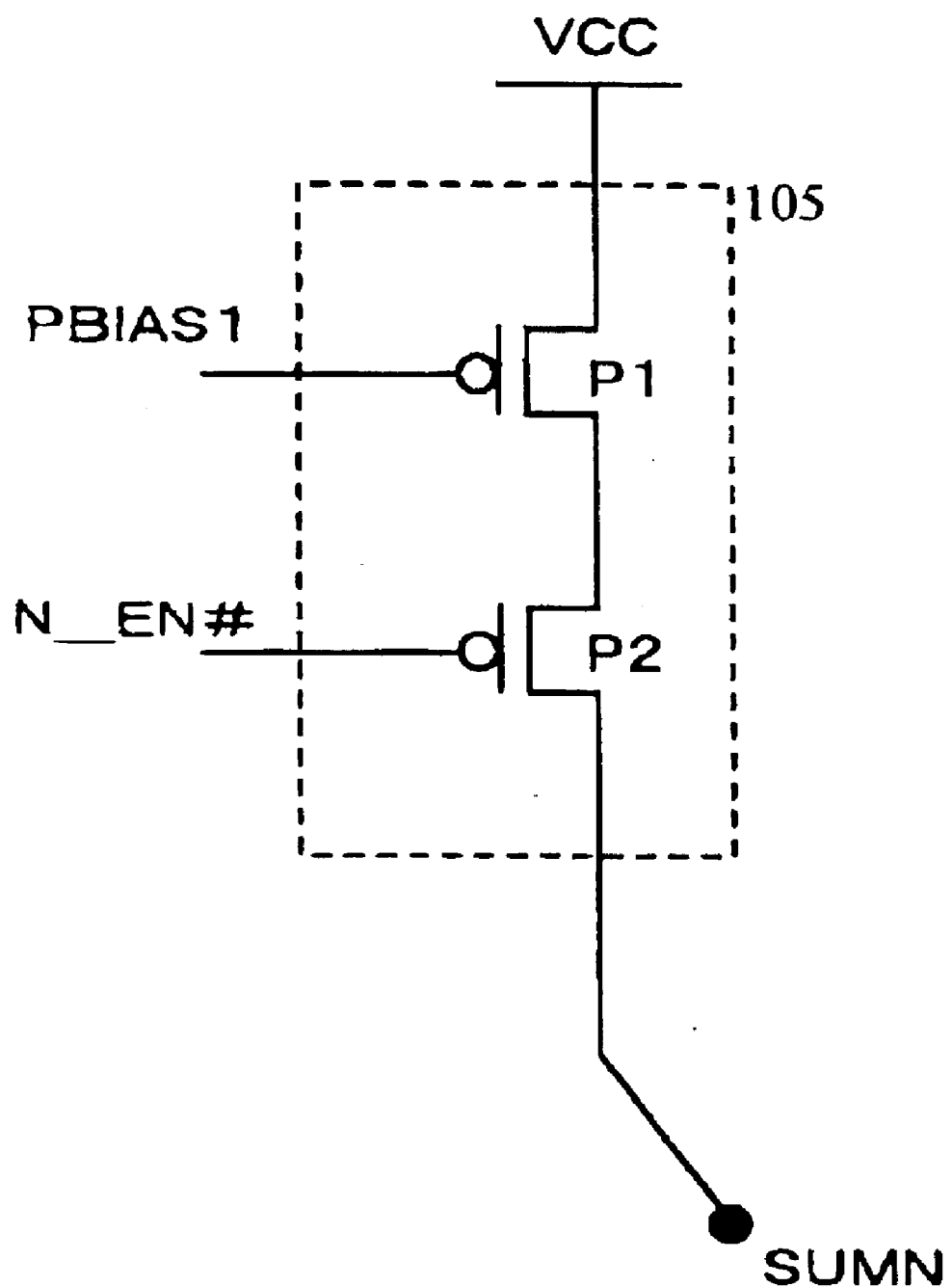
FIG. 5 is a circuit diagram showing still another structure of a current source 105.

Another example of the current source 105 is illustrated in FIG. 5. FIG. 5 is a circuit diagram showing another structure of the current source 105. Another example of the current source 105 is made up of the second resistor element P1 and the second switch element P2 which are serially connected to each other between the power supply potential node and the node SUMN. The second resistor element P1 is made up of a PMOS transistor comprising a source connected to the power supply potential node, a drain connected to the second switch element P2, and a gate to which the bias potential PBIASI is supplied. The second switch element P2 is made up of a PMOS transistor comprising a source connected to the second resistor element P1, a drain connected to the node SUMN, and a gate to which the enable signal N_EN# is inputted. A value of current flowing to the current source 105 is determined by an ON resistance of the PMOS transistor forming the second resistor element P1 and an ON resistance of the PMOS transistor forming the second switch element P2.

Figure 6:
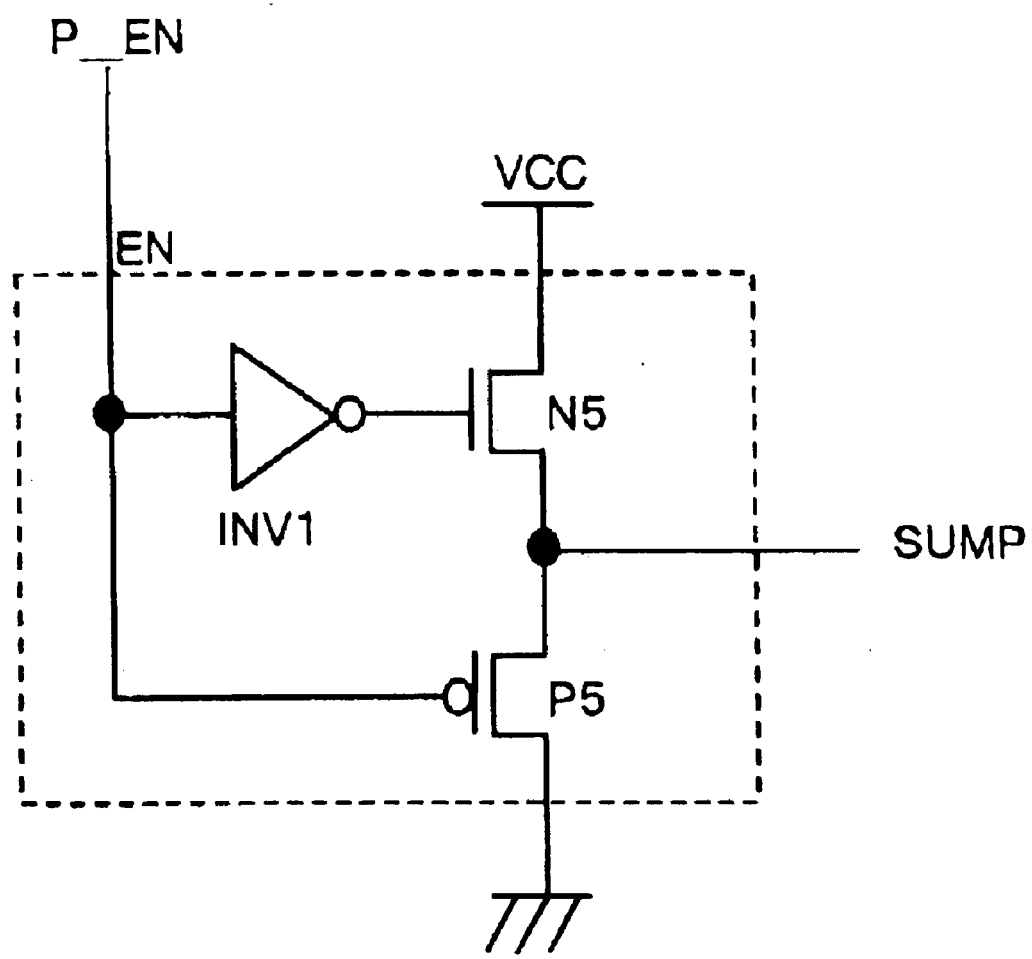
FIG. 6 is a circuit diagram showing the structure of a clamp circuit CL1.

The clamp circuit CL1 is connected to the node SUMP. The clamp circuit CL1 supplies a given potential to the node SUMP when the amplifier 102 is in "inactive state", and stops the supply of the given potential when it is in "active state". More in detail, the clamp circuit CL2 supplies the bias potential VCC/2 to the node SUMP when the enable signal P_EN inputted to the enable terminal EN# is "L" while it stops the supply of the same potential when the enable signal P_EN is "H". The clamp circuit CL1 is described more in detail with reference to FIG. 6. FIG. 6 is a circuit diagram showing the structure of the clamp circuit CL1. The clamp circuit CL1 comprises a third resistor element N5 connected between the power supply potential node and the node SUMP, a fourth resistor element P5 connected between the node SUMP and the ground potential node. The third resistor element N5 is made up of an NMOS transistor comprising a first electrode connected to the power supply potential node, a second electrode connected to the node SUMP and a control electrode to which an inversion signal of the enable signal P_EN is inputted. The fourth resistor element P5 is made up of a PMOS transistor comprising a first electrode connected to the ground potential node, a second electrode connected to the node SUMP and a control electrode to which the enable signal P_EN is inputted.

Figure 7:
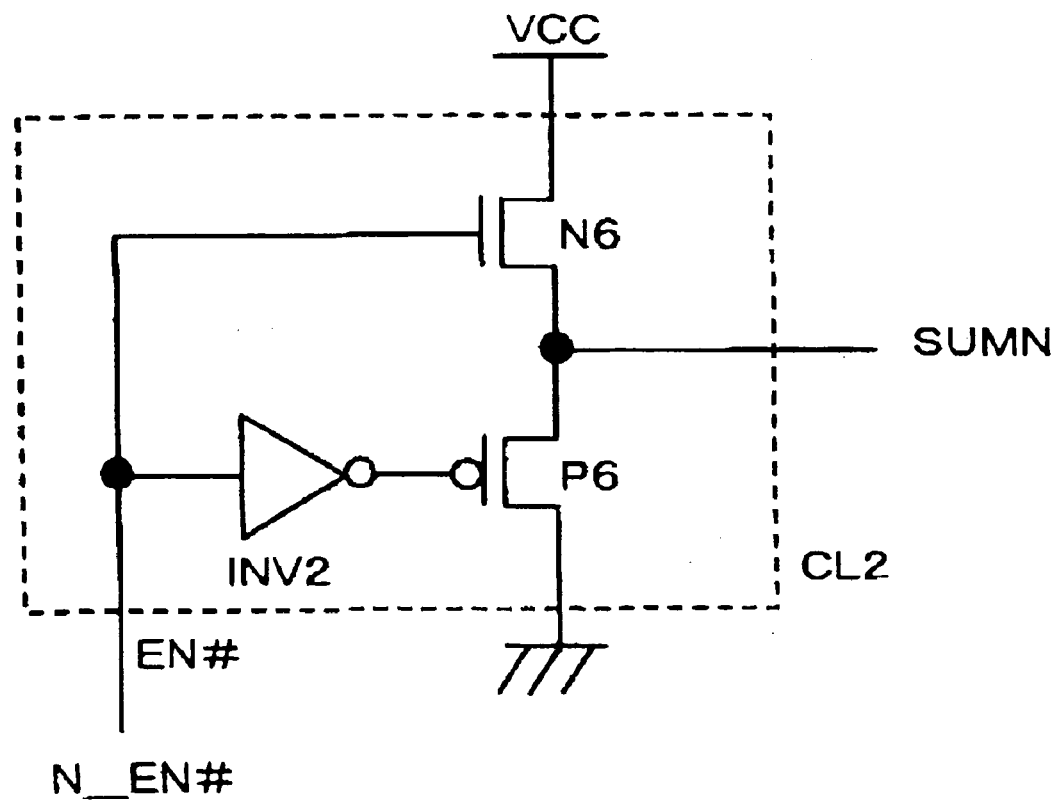
FIG. 7 is a circuit diagram showing the structure of a clamp circuit CL2.

The clamp circuit CL2 is connected to the node SUMN. The clamp circuit CL2 supplies a given potential to the node SUMN when the amplifier 103 is in "inactive state", and the stopping the supply of the given potential when it is in "active state". More in detail, the clamp circuit CL1 supplies the bias potential VCC/2 to the node SUMN when the enable signal N_EN# to be inputted to the enable terminal EN is "H" while it stops the supply of the same potential when the enable signal N_EN# is "L". The clamp circuit CL2 is described more in detail with reference to FIG. 7. FIG. 7 is a circuit diagram showing the structure of the clamp circuit CL2. The clamp circuit CL2 comprises a fifth resistor element N6 connected between the power supply potential node and the node SUMN, a sixth resistor element P6 connected between the node SUMN and the ground potential node. The fifth resistor element N6 is made up of an NMOS transistor comprising a first electrode connected to the power supply potential node, a second electrode connected to the node SUMN and a control electrode to which the enable signal N_EN# is inputted. The sixth resistor element P6 is made up of a PMOS transistor comprising a first electrode connected to the ground potential node, a second electrode connected to the node SUMN, and a control electrode to which the inversion signal of the enable signal N_EN# is inputted.

Figure 8A:
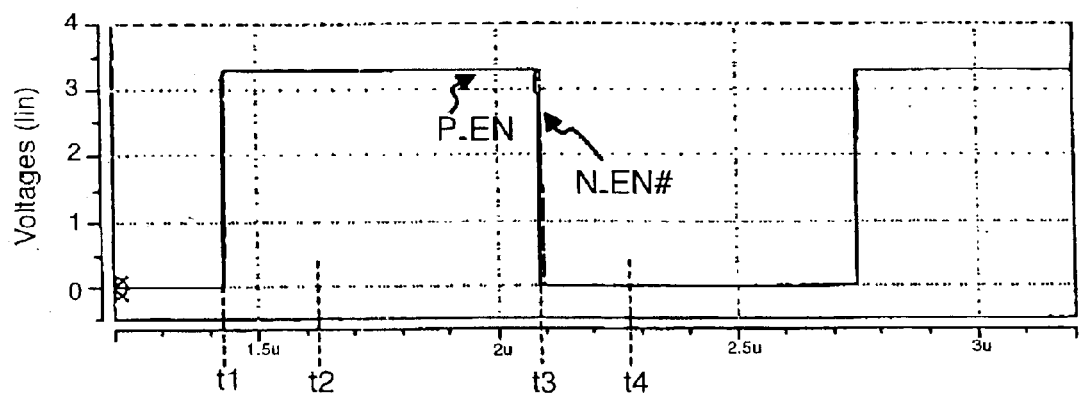
FIGS. 8(a) to 8(d) show waveforms generated when the output buffer circuit according to the first embodiment of the invention operates.
Figure 8B:
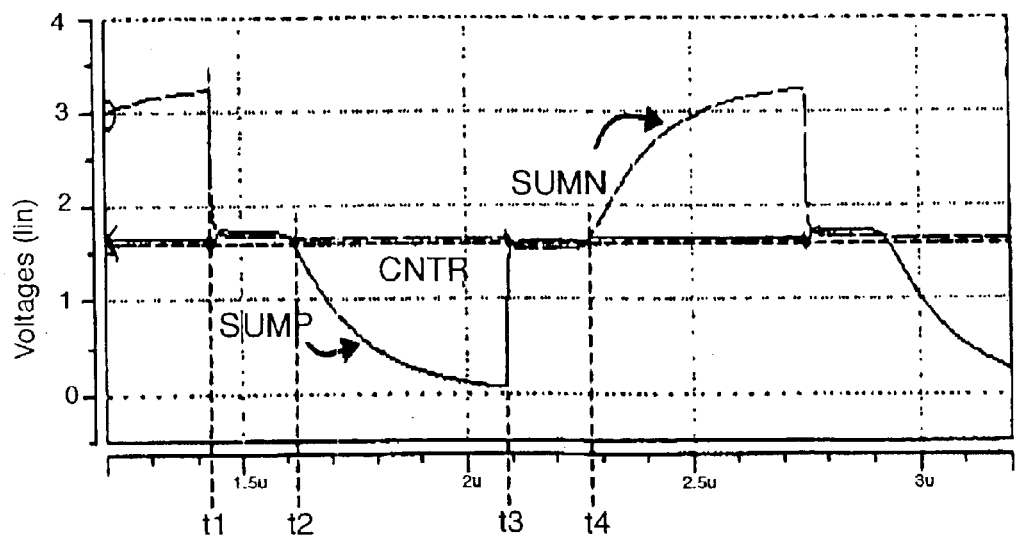
Figure 8C:
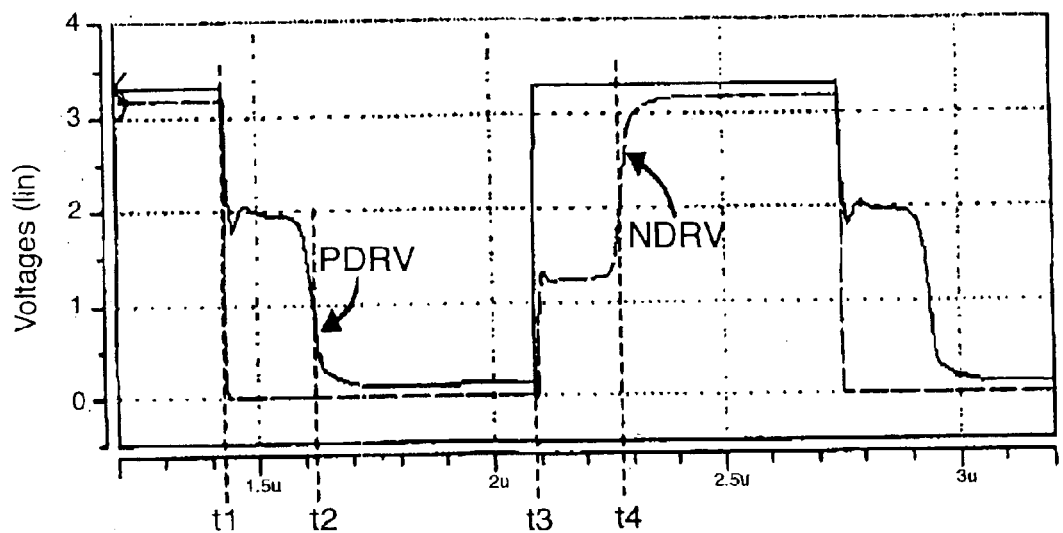
Figure 8D:
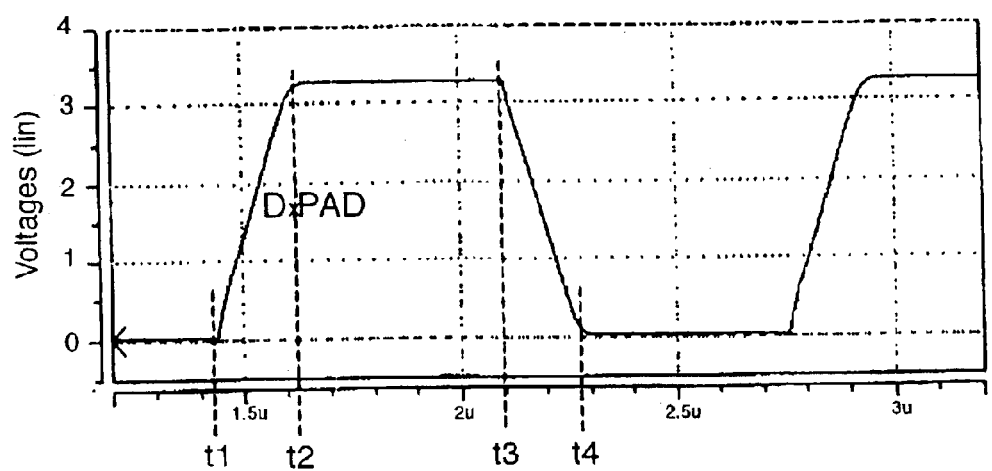

The operation of the output buffer circuit of the first embodiment of the invention is described next with reference to FIG. 8(a) to FIG. 8(d) showing waveforms generated when the output buffer circuit operates, wherein FIG. 8(a) shows levels of the enable signal P_EN and enable signal N_EN #, FIG. 8(b) shows the potential of the node SUMP and node SUMN, FIG. 8(c) shows potentials of the node PDRV and node NDRV, and FIG. 8(d) shows the potential of the output node, wherein the axis of abscissas shows a time, and the axis of ordinates shows a potential.

At time t1, both the enable signal P_EN and enable signal N_EN# become "H" (FIG. 8(a)). Since the enable signal N_EN# becomes "H", the second switch element P2 turns OFF so that the amplifier 103 is in "inactive state" while the clamp circuit CL2 is in "active state" and the switch element N3 turns ON. Since the second switch element P2 turns OFF, the current source 105 is interrupted in its current path. Since the clamp circuit CL2 is in "active state" to output the bias potential VCC/2, a potential of the node SUMN which has been the level of the power supply potential VCC is fixed to the bias potential VCC/2 (FIG. 8(b)). When the node NDRV becomes the level of the ground potential GND (FIG. 8(a)). Further, the switch element N3 turns ON and the node NDRV becomes the level of the ground potential GND. Since the node NDRV becomes the level of the ground potential GND, the output transistor N4 turns OFF.

Further, the enable signal P_EN becomes "H", the first switch element N2 turns ON and the amplifier 102 is in "active state" while the clamp circuit CL1 is in "inactive state" and the switch element P3 turns OFF. Since the first switch element N2 turns ON, a current flows to the current source 104. Since the clamp circuit CL1 is in "inactive state", the operation of the amplifier 102 (control the a rising edge rate) is not influenced thereby.

The amplifier 102 outputs a potential to the node PDRV in response to the potential of the node SUMP occurring (inputted) to the input terminal DM. Since the node SUMP is fixed to the bias potential VCC/2 when the enable signal P_EN is "L", the amplifier 102 can start the control the a rising edge rate at a given timing.

The operation of the amplifier 102 is described now with reference to FIG. 2. The bias potential VCC/2 is inputted to the input terminal DM until time t1. The bias potential VCC/2 is always inputted to the input terminal DP so that the ON resistance of the transistor P24 and that of the transistor N24 are equal to each other. Since the current flowing to the transistor P24 and that flowing to the transistor N24 are equal to each other so that a potential of the node n1, namely a potential of the output terminal is set to become the level of the bias potential VCC/2. When the potential of the input terminal DM increases, a current $I_{N21}$ flowing to the input transistor N21 increases. Since the current $I_{N21}$ increases, a current $I_{P22}$ flowing to the PMOS transistor P22 increases. Since the PMOS transistor P22 and PMOS transistor P23 form current mirrors, when the current $I_{P22}$ of the first current mirror circuit 201 at the current input side increases, a current $I_{P23}$ of the first current mirror circuit 201 at the current output side increases. Meanwhile, if a potential to be supplied to the input terminal DM increases, the current $I_{P21}$ flowing to the input transistor P21 decreases. Since the current $I_{P21}$ decreases, a current $I_{N22}$ flowing to the NMOS transistor N22 decreases. Since the NMOS transistor N22 and the NMOS transistor N23 form the current mirrors, when the current $I_{N22}$ of the second current mirror circuit 202 at the current input side decreases so that the current $I_{N23}$ of the second current mirror circuit 202 at the current output side decreases. Since the current $I_{P23}$ increases and the current $I_{N23}$ decreases, a current by the difference between the current $I_{P23}$−current $I_{N23}$ flows to the transistor N24. Since the bias potential VCC/2 is supplied to the gates of both the transistors N24 and P24, values of ON resistance of both the transistors become equal to each other, so that current $I_{N24}$ flowing to the transistor N24 increases, and hence a potential of the node n1 increases.

When a potential of the input terminal DM lowers, the current $I_{P21}$ flowing to the input transistor P21 increases. Since the current $I_{P21}$ increases, the current $I_{N22}$ flowing to the NMOS transistor N22 increases. Since the NMOS transistor N22 and NMOS transistor N23 form current mirrors, when the current $I_{N22}$ of the second current mirror circuit 202 at the current input side increases, the current $I_{N23}$ of the second current mirror circuit 202 at the current input side increases. Meanwhile, since a potential to be supplied to the input terminal DM lowers, the current $I_{N21}$ flowing to the input transistor N21 decreases. Since the current $I_{N21}$ decreases, the current $I_{P22}$ flowing to the PMOS transistor P22 decreases. Since the PMOS transistor P22 and PMOS transistor P23 form the current mirrors, when the current $I_{P22}$ of the first current mirror circuit 201 at the current input side decreases so that the current $I_{P23}$ of the first current mirror circuit 201 at the current output side decreases. Since the current $I_{N23}$ increases and the current $I_{P23}$ decreases, a current by the difference between the current $I_{N23}$−current $I_{P23}$ flows from the transistor P24 into the NMOS transistor N23. Since the bias potential VCC/2 is supplied to the gates of both the transistor P24 and transistor N24, values of ON resistance of both transistors are equal to each other, so that a current $I_{N24}$ flowing to the transistor P24 increases, and hence a potential of the node n1 lowers. The amplifier 102 operates as set forth above to control the conductive state of the output transistor P4.

During a period from time t1 to time t2, both the node SUMP and the node PDRV fluctuate near the bias potential VCC/2 by the operation of the amplifier 102 set forth above (FIG. 8 (b), FIG. 8 (c)). A current flowing from the power supply potential node into the output node 101 through the output transistor P4 is controlled by the amplifier 102 and capacitor element C1, a potential of the output node 101 increases from the ground potential GND to the power supply potential VCC at a given edge rate (FIG. 8 (d)).

At time t2, the control the a rising edge rate is completed. The potential of the node SUMP lowers to a level of the ground potential GND by the current source 104 (FIG. 8 (b)). Since the potential of the node SUMP lowers to a level of the ground potential GND, the node PDRV lowers to the level of the ground potential GND (FIG. 8 (c)). Since the the node PDRV lowers to the level of the ground potential GND, the output transistor P4 keeps ON state and the potential of the output node 101 is held at the level of the power supply potential VCC (FIG. 8 (d)).

At time t3, both the enable signal P_EN and enable signal N_EN# become "L" (FIG. 8(a)). Since the enable signal N_EN# becomes "L", the first switch element N2 turns OFF so that the amplifier 102 is in "inactive state" while the clamp circuit CL1 is in "active state" and the switch element P3 turns ON. Since the first switch element N2 turns OFF, the current source 104 is interrupted in its current path. Since the clamp circuit CL1 is in "active state" and outputs the bias potential VCC/2, a potential of the node SUMP which has been the level of the ground potential GND is fixed to the bias potential VCC/2 (FIG. 8(b)). When the switch element P3 turns ON and the node PDRV becomes power supply potential VCC (FIG. 8(c)). Since the node PDRV becomes power supply potential VCC, the output transistor P4 turns OFF.

Further, since the enable signal N_EN# becomes "L", the second switch element P2 turns ON and the amplifier 103 is in "active state" while the clamp circuit CL2 is in "inactive state" and the switch element N3 turns OFF. Since the second switch element P2 turns OFF, a current flows to the current source 105. Since the clamp circuit CL2 is in "inactive state", the operation of the amplifier 103 (control of the falling edge rate) is not influenced thereby.

The amplifier 103 outputs a potential to the node NDRV in response to the potential of the node SUMN occurring (or inputted) to the input terminal DM. Since the node SUMN is fixed to the bias potential VCC/2 when the enable signal N_EN# is "H", the amplifier 103 can start the control of the falling edge rate at a given timing. The operation of the amplifier 103 is described with reference to FIG. 3. The bias potential VCC/2 is inputted to the input terminal DM during a period from time t1 to time t3. The bias potential VCC/2 is always inputted to the input terminal DP so that the ON resistance of the transistor P24 and that of the transistor N24 are equal to each other. Since the current flowing to the transistor P24 and that flowing to the transistor N24 are equal to each other so that a potential of the node n1, namely a potential of the output terminal is set to become the level of the bias potential VCC/2. When the potential at the input terminal DM increases, the current $I_{N21}$ flowing to the input transistor N21 increases. Since the current $I_{N21}$ increases, the current $I_{P22}$ flowing to the PMOS transistor P22 increases. Since the PMOS transistor P22 and PMOS transistor P23 form current mirrors, when the current $I_{P22}$ of the first current mirror circuit 201 at the current input side increases, the current $I_{P23}$ of the first current mirror circuit 201 at the current output side increases. Meanwhile, since the potential to be supplied to the input terminal DM increases, the current $I_{P21}$ flowing to the input transistor P21 decreases. Since the current $I_{P21}$ decreases, the current $I_{N22}$ flowing to the NMOS transistor N22 decreases. Since the NMOS transistor N22 and the NMOS transistor N23 form the current mirrors, when the current $I_{N22}$ of the second current mirror circuit 202 at the current input side decreases so that the current $I_{N23}$ of the second current mirror circuit 202 at the current output side decreases. Since the current $I_{P23}$ increases and the current $I_{N23}$ decreases, a current by the difference between the current $I_{P23}$–current $I_{N23}$ flows into the transistor N24. Since the bias potential VCC/2 is supplied to the gates of both the transistors N24 and P24, values of ON resistance of both the transistors become equal to each other, so that the current $I_{N24}$ flowing to the transistor N24 increases, and hence a potential of the node n1 increases.

When a potential of the input terminal DM lowers, the current $I_{P21}$ flowing to the input transistor P21 increases. When the current $I_{P21}$ increases, the current $I_{N22}$ flowing to the NMOS transistor N22 increases. Since the NMOS transistor N22 and NMOS transistor N23 form current mirrors, when the current $I_{N22}$ of the second current mirror circuit 202 at the current input side increases, the current $I_{N23}$ of the second current mirror circuit 202 at the current input side increases. Meanwhile, since a potential to be supplied to the input terminal DM lowers, the current $I_{N21}$ flowing to the input transistor N21 decreases. Since the current $I_{N21}$ decreases, the current $I_{P22}$ flowing to the PMOS transistor P22 decreases. Since the PMOS transistor P22 and PMOS transistor P23 form the current mirrors, when the current $I_{P22}$ of the first current mirror circuit 201 at the current input side decreases, the current $I_{P23}$ of first current mirror circuit 201 at the current output side decreases. Since the current $I_{N23}$ increases and the current $I_{P23}$ decreases, a current by the difference between the current $I_{N23}$–current $I_{P23}$ flows into the transistor P24. Since the bias potential VCC/2 is supplied to the gates of both the transistors P24 and N24, values of ON resistance of both the transistors become equal to each other, so that the current $I_{N24}$ flowing to the transistor P24 increases, and hence a potential of the node n1 lowers. The amplifier 103 operates as set forth above, and controls the conductive state of the output transistor N4.

During a period from time t3 to time t4, the node SUMN and the node NDRV fluctuate near the bias potential VCC/2 by the operation of the amplifier 103 set forth above (FIG. 8 (b), FIG. 8 (c)). A current flowing to the ground potential node from the output node 101 through the output transistor N4 is controlled by the amplifier 103 and the capacitor element C2, a potential of the output node 101 lowers from the power supply potential VCC to the ground potential GND at a given edge rate (FIG. 8 (d)).

At time t4, the control of the falling edge rate is completed. Since a current is supplied by the current source 105, the potential of the node SUMN increases to a level of the power supply potential VCC (FIG. 8 (b)). Since the node SUMN rises to the level of the power supply potential VCC, the node PDRV increases to the level of the power supply potential VCC (FIG. 8 (c)). Since the node NDRV becomes the level of the power supply potential VCC, the output transistor N4 keeps ON state. Since the output transistor N4 keeps ON state, the potential of the output node 101 is held at the level of the ground potential GND (FIG. 8 (d)). Subsequent operations are carried out by repeating the foregoing operations.

As explained above, since the output buffer circuit according to the first embodiment is provided with the clamp circuit CL1 for supplying the bias potential VCC/2 to the node SUMP when the amplifier 102 is inactivated while stopping the supply of the same potential when the amplifier 102 is activated, and the clamp circuit CL2 for supplying the bias potential VCC/2 to the node SUMN when the amplifier 103 is inactivated and stopping supply of the same potential when the amplifier 103 is activated, it is possible to achieve an output buffer circuit having a sufficient operation speed without influencing upon the control of the edge rate. Accordingly, the output buffer circuit of the first embodiment can fully satisfy an AC standard of a USB output buffer circuit, particularly a VCRS (crossover voltage) standard.

Second Preferred Embodiment

Figure 9:
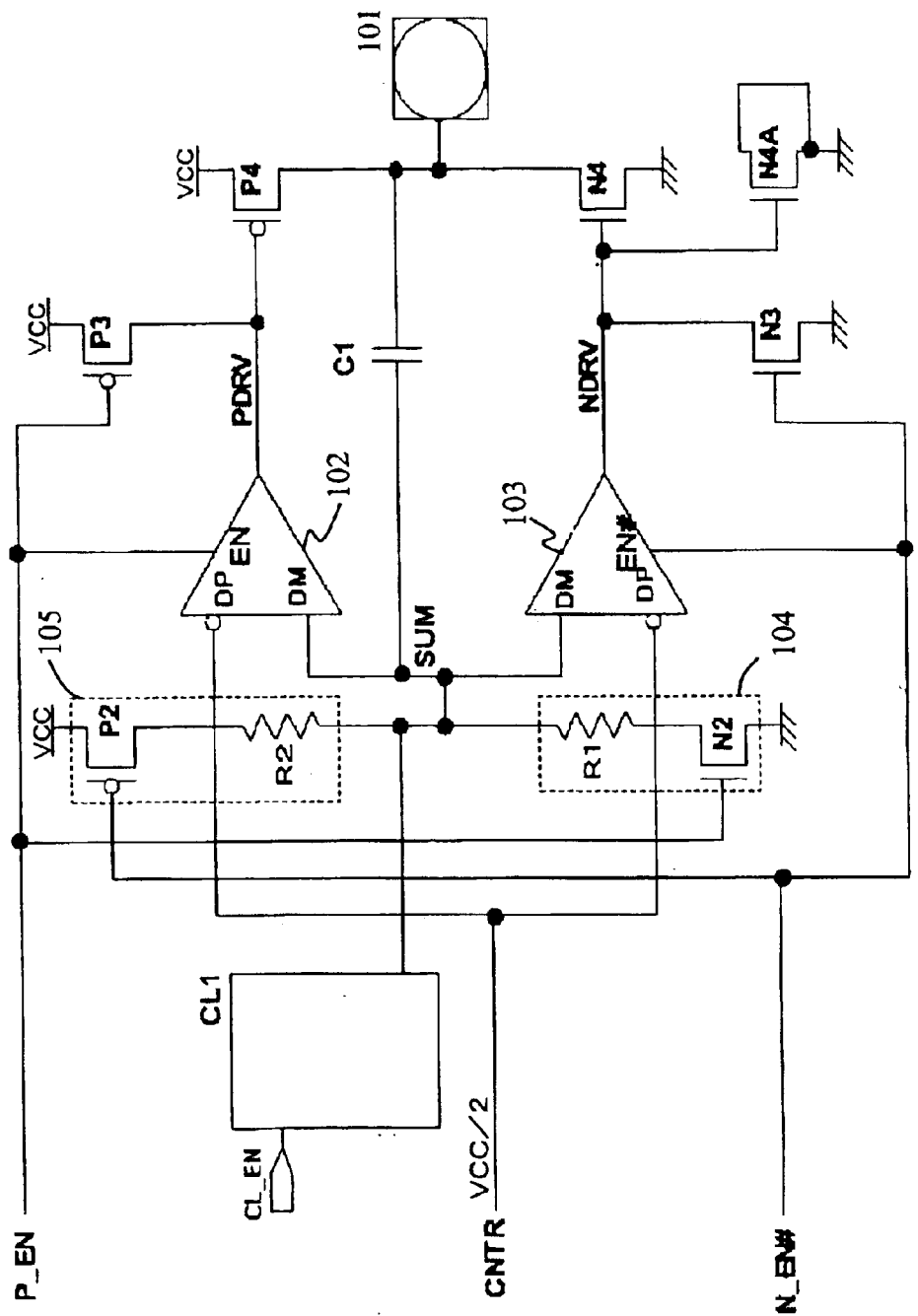
FIG. 9 is a circuit diagram the structure of an output buffer circuit according to a second embodiment of the invention.

An output buffer circuit according to a second embodiment of the invention is described. FIG. 9 is a circuit diagram showing the structure of the output buffer circuit according to the second embodiment of the invention. The output buffer circuit shown in FIG. 9 is different from that of the first embodiment in respect of the provision of one common node instead of the node SUMP and node SUMN provided in the first embodiment. The common node is hereinafter referred to as a node SUM (first node). A capacitor element C1 is connected between the node SUM and an output node 101. A clamp circuit CL1 which operates in response to an enable signal CL_EN (third control signal) is connected to the node SUM. A first current source 104 and a second current source 105 may be formed of circuit configurations as shown in FIGS. 4 and 5 and they are not limited to the circuit configuration shown in FIG. 9. Other circuit configurations are the same as those of the output buffer circuit according to the first embodiment of the invention.

The clamp circuit CL1 supplies a given potential to the node SUM during a given period that before the control of the edge rate is started (a first given period before a first or second control circuit is activated), and stops the supply of the given potential during a given period that the control of the edge rate is effected (during a second given period that the first or second control circuit is activated). More in detail, the clamp circuit CL1 supplies a bias potential VCC/2 to the node SUM during a period that the enable signal CL_EN of "H" (first logical level) is inputted to an enable terminal EN and stops the supply of the same potential during a period that the enable signal CL_EN of "L" (second logical level) is inputted thereto. The enable signal CL_EN to be inputted to the clamp circuit CL1 is a signal which becomes "H" during a given period that immediately before the enable signal P_EN and enable signal N_EN# are switched to from "H" to "L" or "L" to "H" (immediately before the control of the rising edge rate and falling edge rate is started). The period that the enable signal CL_EN becomes "H" is a period which is, for example, about one eighth of a period that the enable signal P_EN and enable signal N_EN# become "H" or "L". The enable signal CL_EN is outputted from a pre-driver (not shown) provided in a front stage of the output buffer circuit in the same manner as the enable signal P_EN and enable signal N_EN #.

Figure 10:
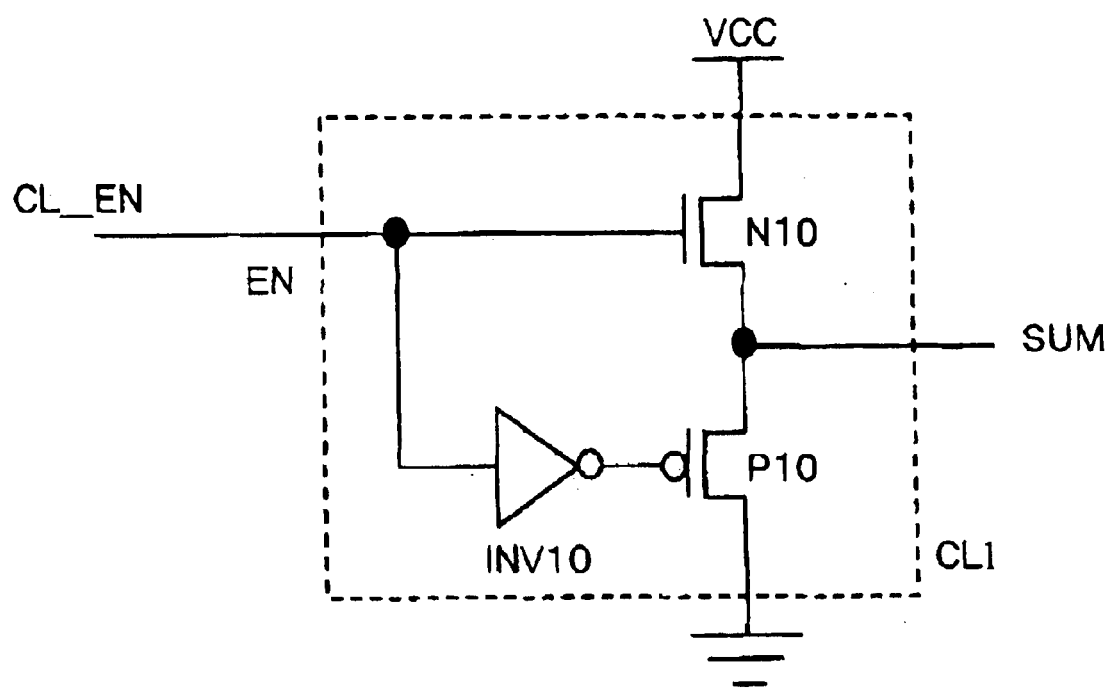
FIG. 10 is a circuit diagram showing the structure of a clamp circuit CL1.

The clamp circuit CL1 is described more in detail with reference to FIG. 10. FIG. 10 is a circuit diagram showing the structure of the clamp circuit CL1. The clamp circuit CL1 comprises a first resistor element N10 connected between a power supply potential node and the node SUM, and a second resistor element P10 connected between the node SUM and a ground potential node GND. The first resistor element N10 is made up of an NMOS transistor comprising a first electrode connected to the power supply potential node, a second electrode connected to the node SUM, and a control electrode to which the enable signal CL_EN is inputted. The second resistor element P10 is made up of a PMOS transistor comprising a first electrode connected to the ground potential node, a second electrode connected to the node SUM, and a control electrode to which an inverted signal of the enable signal CL_EN is inputted.

Figure 11A:
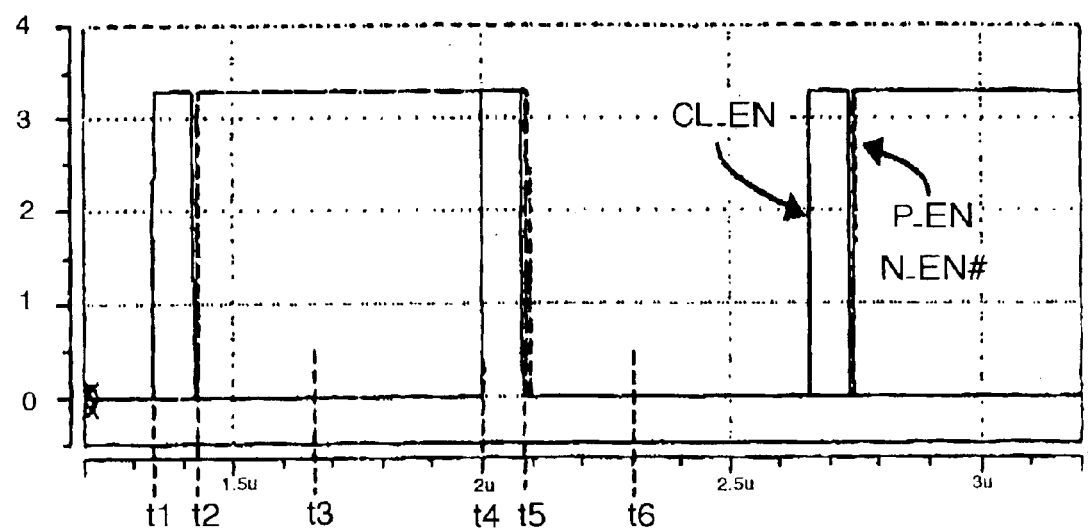
FIG. 11 shows waveforms generated when the output buffer circuit according to the second embodiment of the invention operates.
Figure 11B:
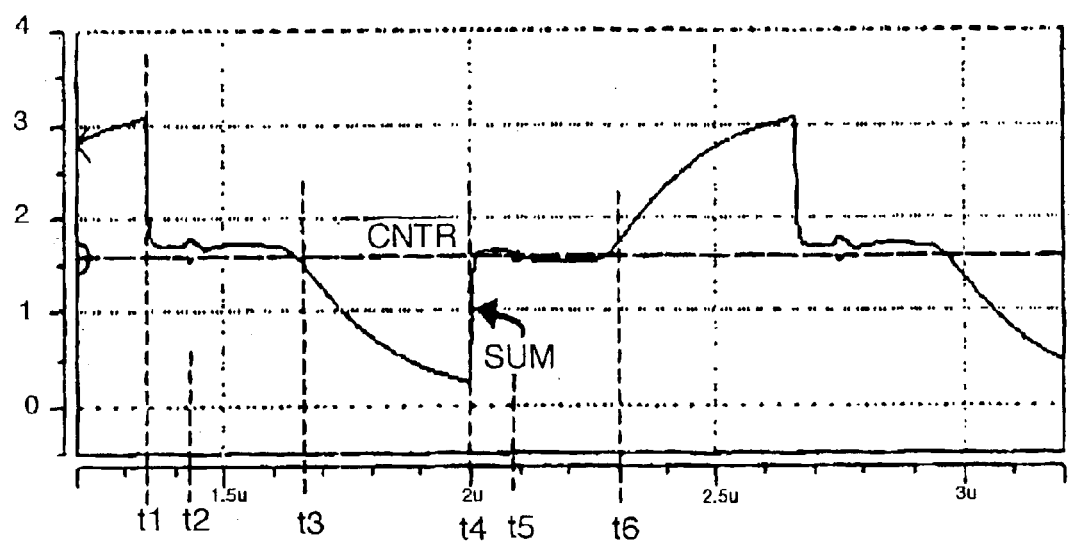
Figure 11C:
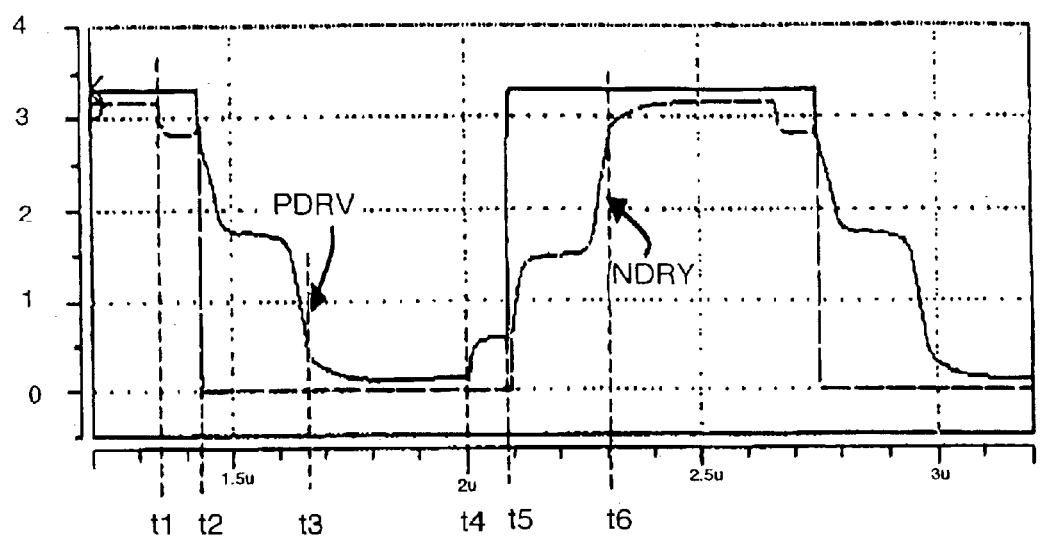
Figure 11D:
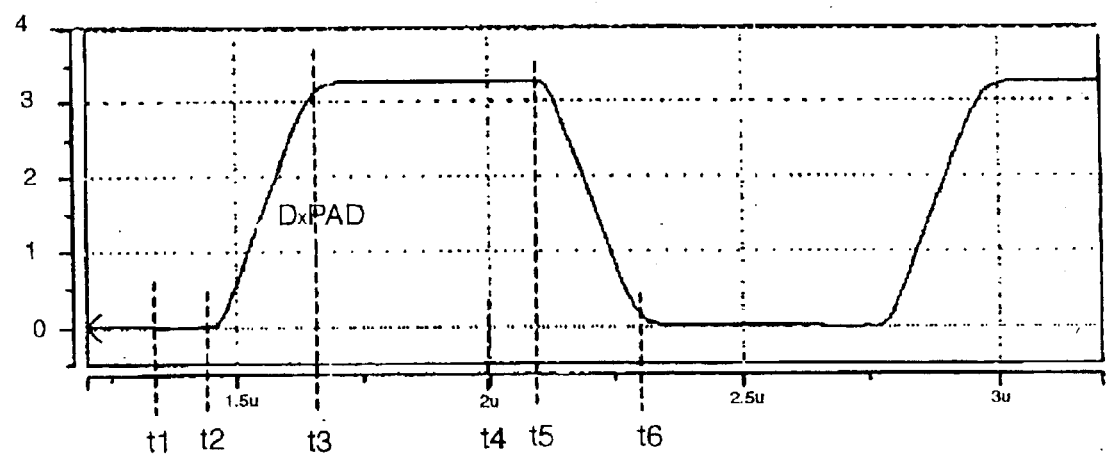

The operation of the output buffer circuit according to the second embodiment is described next with reference to FIG. 11(a) to FIG. 11(d). FIG. 11(a) to FIG. 11(d) show waveforms generated when the output buffer circuit operates, wherein FIG. 11(a) shows levels of the enable signal CL_EN, enable signal P_EN and enable signal N_EN #, FIG. 11(b) shows the potential of the node SUM, FIG. 11(c) shows potentials of the node PDRV and node NDRV, and FIG. 11(d) shows the potential of the output node 101, wherein the axis of abscissas shows a time, and the axis of ordinates shows a potential.

At time t1, the enable signal CL_EN becomes "H" (FIG. 11(a)). At this time, both the enable signal P_EN and enable signal N_EN# are held at "L". Since the enable signal CL_EN becomes "H", the clamp circuit CL1 is in "active state" to output the bias potential VCC/2 to the node SUM. Accordingly, the node SUM which has been the level of the ground potential GND is instantly fixed to bias potential VCC/2 (FIG. 11(b)).

At time t2, the enable signal CL_EN becomes "L", while the enable signal P_EN and enable signal N_EN# become "H" (FIG. 11(a)). Since the enable signal CL_EN becomes "L", the clamp circuit CL1 is in "inactive state". Since the clamp circuit CL1 is in "inactive state", it does not influence upon the operation of an amplifier 102 (control of the rising edge rate). Since the enable signal N_EN# becomes "H", a switch element P2 turns OFF, and the amplifier 103 is in "inactive state", and a switch element N3 turns ON. Since the switch element P2 turns OFF, the current source 105 is interrupted in its current path. Since the switch element N3 turns ON, the node NDRV becomes a level of the ground potential GND (FIG. 11(c)). Since the node NDRV becomes the level of the ground potential GND, an output transistor N4 turns OFF.

Since the enable signal P_EN becomes "H", the switch element N2 turns ON, and the amplifier 102 is in "active state", while a switch element P3 turns OFF. Since the switch element N2 turns ON, a current flows to the current source 104. The amplifier 102 outputs a potential to the node PDRV in response to a potential to be inputted to an input terminal DM. Since the node SUM is already fixed to bias potential VCC/2 by the clamp circuit CL1, the amplifier 102 can start the control of the a rising edge rate in a given timing. The amplifier 102 operates in the same manner as set forth in the first embodiment, and controls a conductive state of the output transistor P4.

Both the node SUM and node PDRV fluctuate near the bias potential VCC/2 by the operation of the amplifier 102 during a period from time t2 to time t3 (FIG. 11(b) and FIG. 11(c)). A current which flows from the power supply potential node to the output node 101 is controlled by the amplifier 102 and capacitor element C1 so that the potential of the output node 101 increases from the ground potential GND to the power supply potential VCC at a given edge rate.

During a period from time t2 to time t3, both the node SUM and node NDRV fluctuate near the bias potential VCC/2 by the operation of the amplifier 102 (FIG. 11(b) and FIG. 11(c)). A current which flows from the ground potential node to the output node 101 is controlled by the amplifier 102 and capacitor element C1 so that the potential of the output node 101 rises from the ground potential GND to the power supply potential VCC (FIG. 11(d)).

At time t3, the control the a rising edge rate is completed. The node SUM lowers to the level of the ground potential GND by the current source 104 (FIG. 11(b)). Since the node SUM lowers to the level of the ground potential GND, the node PDRV lowers to the level of the ground potential GND (FIG. 11(c)). Since the node PDRV lowers to the level of the ground potential GND, the output transistor P4 keeps ON state and the potential of the output node 101 keeps the power supply potential VCC (FIG. 11(d)).

At time t4, the enable signal CL_EN becomes "H" (FIG. 11(a)). At this time, both the enable signal P_EN and enable signal N_EN# are held at "H" (FIG. 11(a)). Since the enable signal CL_EN becomes "H", the clamp circuit CL1 is in "active state" to output the bias potential VCC/2 to the node SUM. Accordingly, the node SUM which has been the level of the ground potential GND is instantly fixed to the bias potential VCC/2 (FIG. 11(b)).

At time t5, both the enable signal CL_EN, and the enable signal N_EN# become "L" (FIG. 11(a)). Since the enable signal CL_EN becomes "L", the clamp circuit CL1 is in "inactive state". Since the clamp circuit CL1 is in "inactive state", it does not influence upon the operation of the amplifier 103 (control of the falling edge rate). Since the enable signal P_EN becomes "L", the switch element N2 turns OFF, and the amplifier 102 is in "inactive state" while the switch element P3 turns ON. Since the switch element N2 turns OFF, the current source 104 is interrupted in its current path. Accordingly, the switch element P3 turns ON, and the node PDRV becomes a level of the power supply potential VCC (FIG. 11(c)). Since the node PDRV becomes a level of the power supply potential VCC, the output transistor P4 turns OFF.

Since the enable signal N_EN# becomes "L", the switch element P2 turns ON and the amplifier 103 is in "active state" while the switch element N3 turns OFF. Since the switch element P2 turns ON, a current flows to the current source 105. The amplifier 103 outputs a potential to the node NDRV in response to a potential to be inputted to the input terminal DM. Since the node SUM is already fixed to bias potential VCC/2 by the clamp circuit CL1, the amplifier 103 can start the control of the falling edge rate in a given timing. The amplifier 103 operates in the same manner as set forth in the first embodiment, and controls a conductive state of the output transistor N4.

During a period from time t5 to time t6, both the node SUM and node NDRV fluctuate near the bias potential VCC/2 by the operation of the amplifier 103 (FIG. 11(b) and FIG. 11(c)). A current which flows from the output node 101 to the ground potential node is controlled by the amplifier 103 and capacitor element C1 so that the potential of the output node 101 lowers from the power supply potential VCC to the ground potential GND (FIG. 11(d)).

At time t6, the control of the falling edge rate is completed. Since the electric charge from the current source 105 is accumulated in the capacitor element C1, the node SUM rises to the level of the power supply potential VCC (FIG. 11(b)). Since the node SUM becomes the level of the power supply potential VCC, the the node NDRV becomes the level of the power supply potential VCC (FIG. 11(c)). Since the node NDRV becomes the level of the power supply potential VCC and the output transistor N4 keeps ON state, the output node 101 is held at the level of the ground potential GND (FIG. 11(d)). Subsequently, the foregoing operations are repeated.

As explained above, since the output buffer circuit of the second embodiment is provided with the clamp circuit CL1 for supplying a given potential to the node SUM during a first given period that before both the amplifiers 102 and 103 are activated while stopping the supply of the given potential to the node SUM during a second given period that both the amplifiers 102 and 103 are inactivated upon elapse of the first given period, it can start the control of the edge rate at a given timing without influencing upon the control of the edge rate. Accordingly, the output buffer circuit of the first embodiment can fully satisfy an AC standard of a USB output buffer circuit, particularly a VCRS (crossover voltage) standard. Further, according to the output buffer circuit of the second embodiment, since both the rising edge rate and falling edge rate are controlled by use of a common feedback capacitor element, it is possible to avoid the increase of a circuit area.

Third Preferred Embodiment

Figure 12:
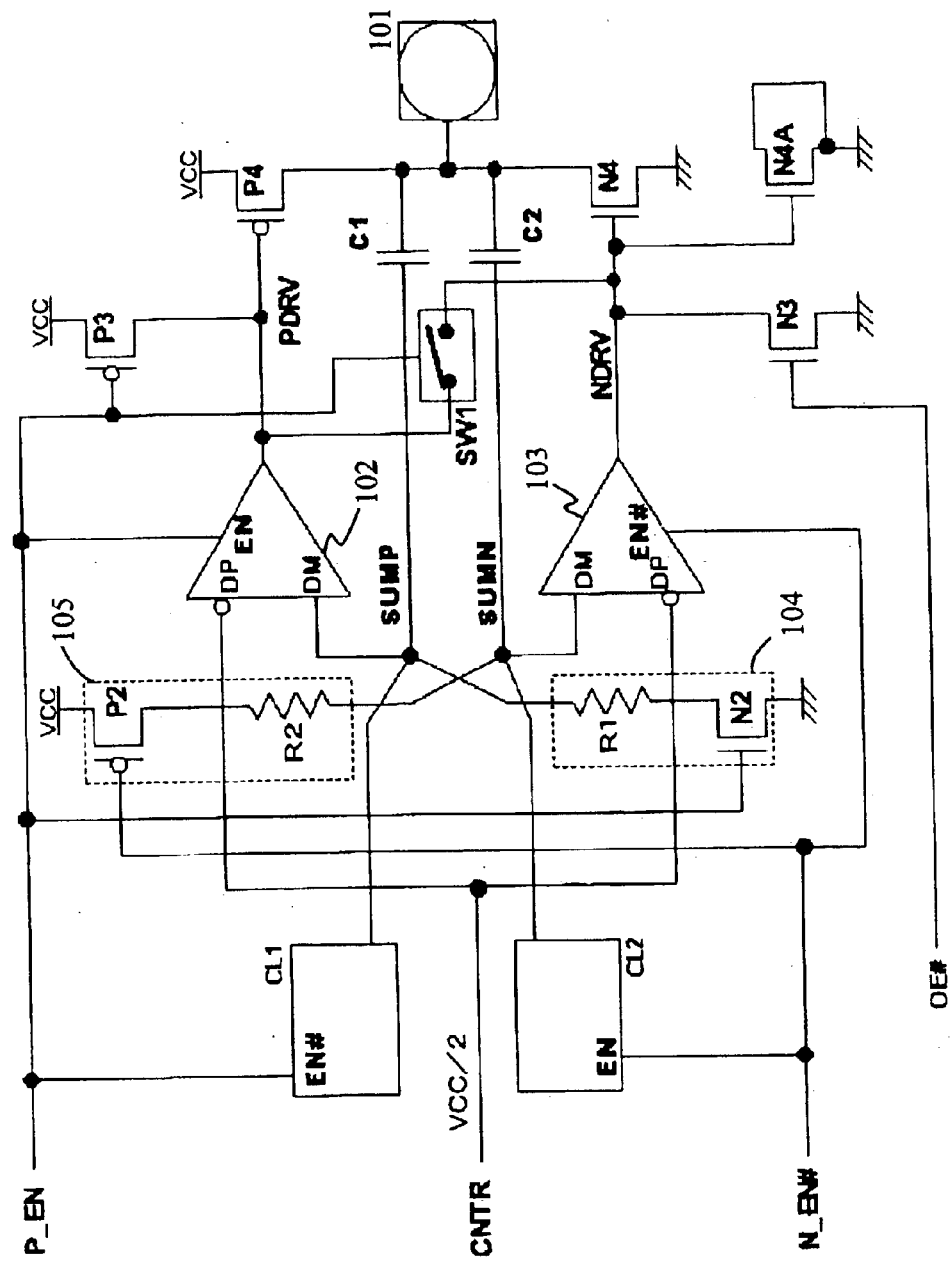
FIG. 12 is a circuit diagram showing the structure of an output buffer circuit according to a third embodiment of the invention.
Figure 13:
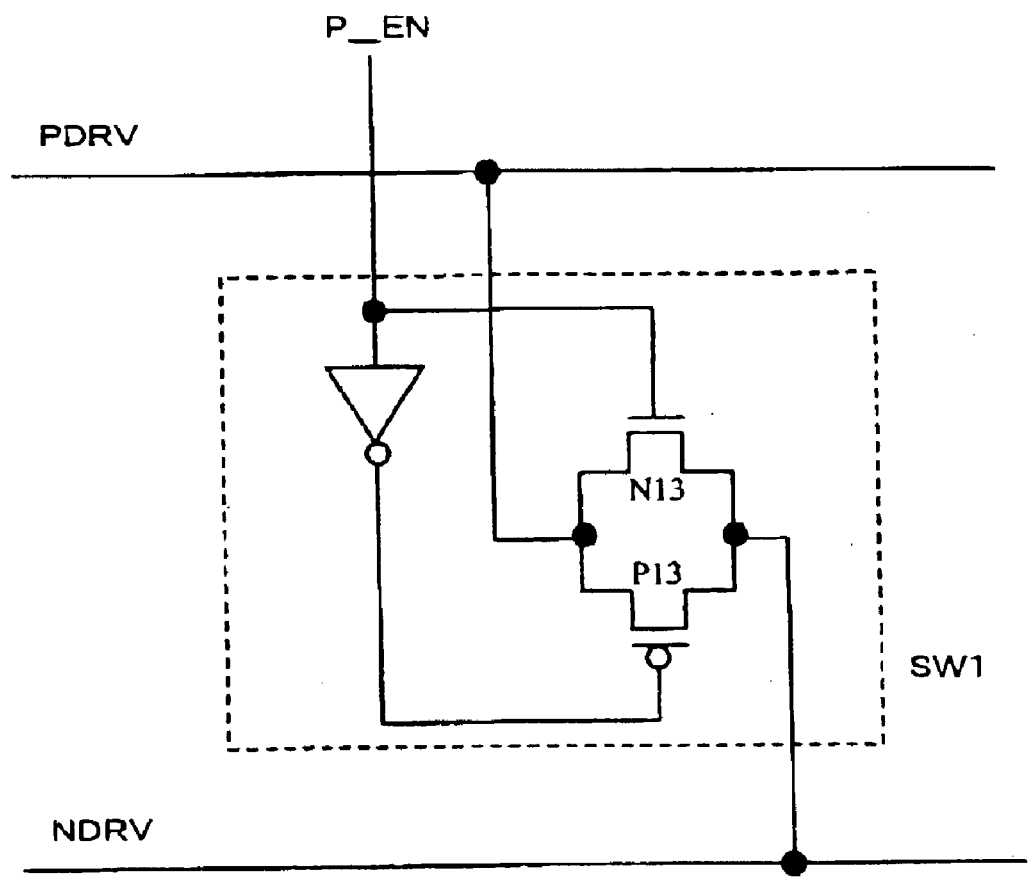
FIG. 13 is a circuit diagram showing the structure of a switch circuit SW1.

An output buffer circuit according to a third embodiment of the invention is described. FIG. 12 is a circuit diagram showing the structure of the output buffer circuit according to the third embodiment of the invention. The output buffer circuit of the third embodiment is different from that of the first embodiment in respect of the provision of a switch circuit SW1. Other circuit configurations are the same as those of the first embodiment. The switch circuit SW1 is connected between a node PDRV and a node NDRV. The switch circuit SW1 connects between the node PDRV and node NDRV during a period that it controls the rising edge rate. More in detail, the switch circuit SW1 turns ON when an enable signal P_EN becomes "H" while it turns OFF when the enable signal P_EN becomes "L". The circuit configuration of the switch circuit SW1 is described with reference to FIG. 13. FIG. 13 is a circuit diagram showing the structure of the switch circuit SW1. In FIG. 13, the switch circuit SW1 comprises a switch element N13 and a switch element P13. The switch element N13 is made up of an NMOS transistor comprising a first electrode connected to the gate of the output transistor P4, a second electrode connected to the gate of the output transistor N4, and a gate (control electrode) to which the enable signal P_EN (control signal) is applied. The switch element P13 is made up of a PMOS transistor comprising a first electrode connected to a gate of the output transistor P4, a second electrode connected to a gate of the output transistor N4, and a gate (control electrode) to which an inverted signal of the enable signal P_EN is applied.

Figure 14A:
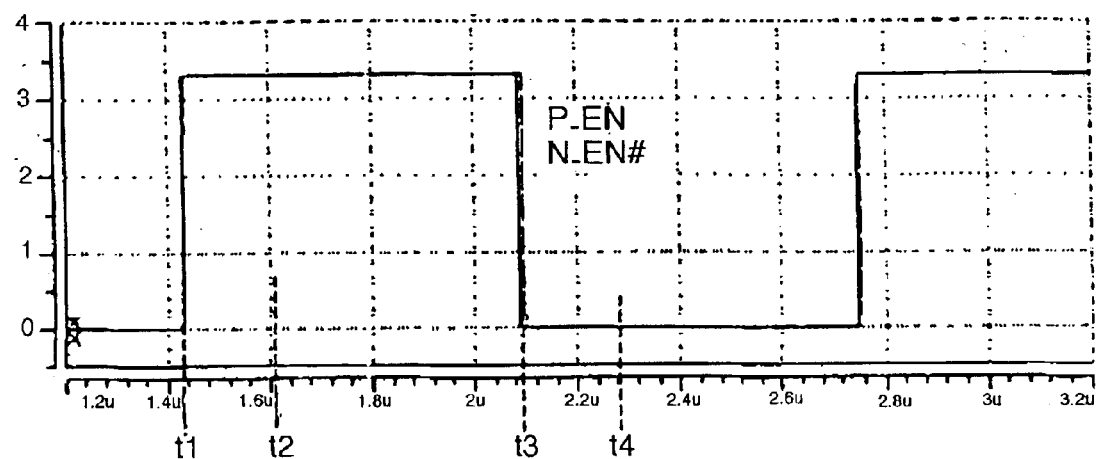
FIG. 14 shows waveforms generated when the output buffer circuit according to the third embodiment of the invention operates.
Figure 14B:
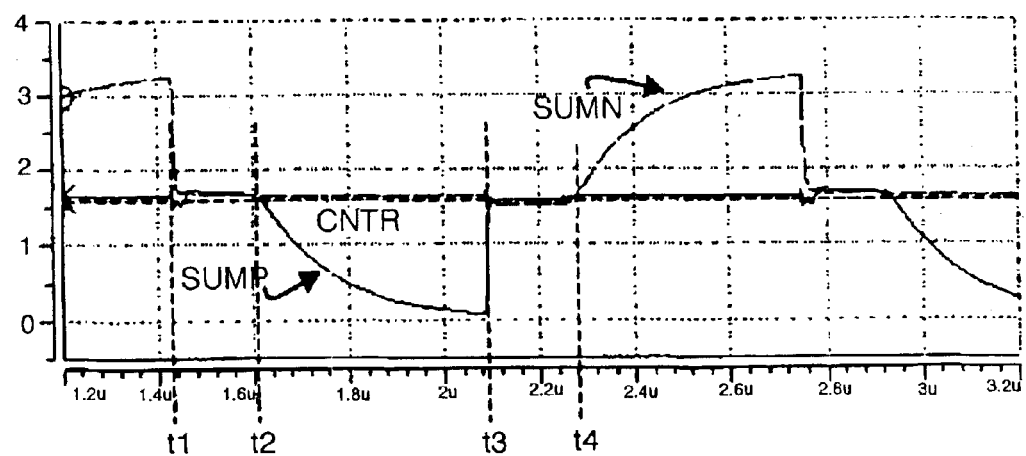
Figure 14C:
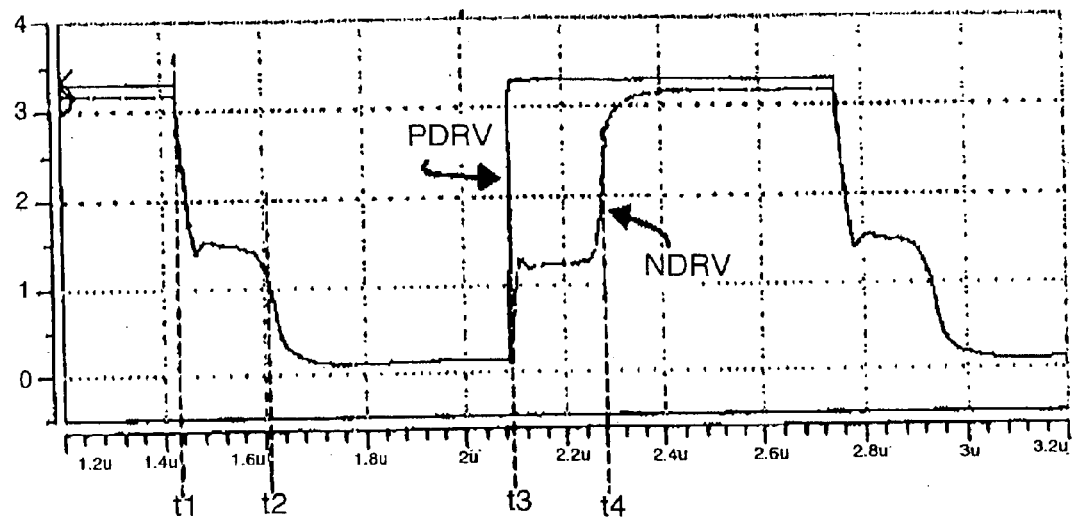
Figure 14D:
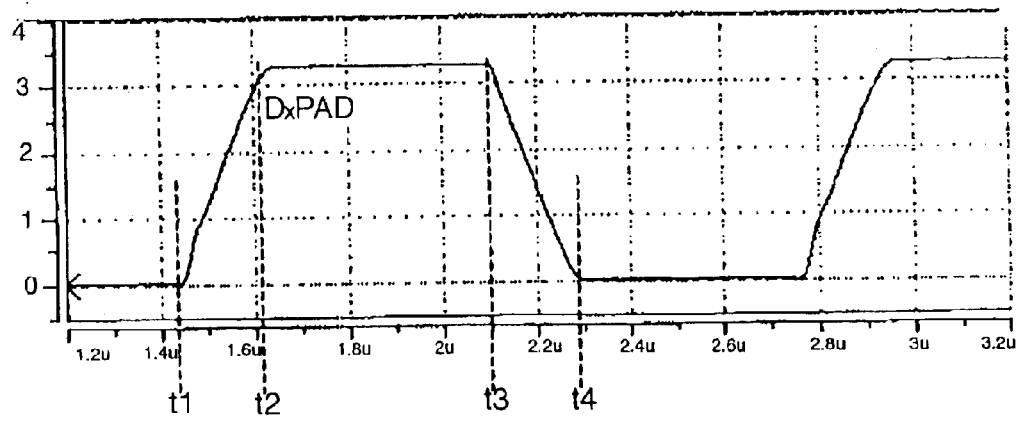

The operation of the output buffer circuit according to the second embodiment of the invention is described next. FIG. 14(a) to FIG. 14(d) show waveforms generated when the output buffer circuit operates, wherein FIG. 14(a) shows levels of the enable signal P_EN and enable signal N_EN#, FIG. 14(b) shows the potential of the node SUMP and node SUMN, FIG. 14(c) shows potentials of the node PDRV and node NDRV, and FIG. 14(d) shows the potential of the output node 101, wherein the axis of abscissas shows a time, and the axis of ordinates shows a potential.

At time t1, both the enable signal P_EN and enable signal N_EN# become "H" (FIG. 14(a)). Since the enable signal P_EN becomes "H", the switch circuit SW1 turns ON, a switch element N2 turns ON, and an amplifier 102 is in "active state", while a clamp circuit CL1 is in "inactive state", and a switch element P3 turns OFF. Since the switch element N2 turns ON, a constant current flows to the current source 104. A current which flows when the electric charge accumulated in the capacitor element C1 is discharged and a current from the input terminal DM of the amplifier 102 flows into the current source 104. The operation of the amplifier 102 is same as that of the amplifier 102 of the first embodiment.

Since the enable signal N_EN# becomes "H", the switch element P2 turns OFF and the amplifier 103 is in "inactive state" while the clamp circuit CL2 is in "active state". Since the switch element P2 turns OFF, the current source 105 is interrupted in its the current path. Since the clamp circuit CL2 is in "active state" and outputs the bias potential VCC/2, a potential of the node SUMN which has been the level of the power supply potential VCC is fixed to the bias potential VCC/2 (FIG. 14(b)). Since the switch circuit SW1 turns ON, the node NDRV is connected to the node PDRV and it becomes the level of the bias potential VCC/2 like the node PDRV (FIG. 14(c)). Since the node NDRV becomes the level of the bias potential VCC/2, the output transistor N4 turns ON.

In the case where the output buffer circuit of the third embodiment is used as a low speed (LS) driver of a USB, a pull-up resistor is connected into the output node 101. A current flows from the power supply potential node to the output node 101 through the pull-up resistor. Supposing that the node NDRV is the level of the ground potential GND without providing the switch circuit SW1, the output transistor N4 turns OFF, thereby losing an electric path for letting off a current which flowed thereinto through the pull-up resistor. As a result, the current keeps flowing into the output node 101, which influences upon the control of the rising edge rate. However, according to the output buffer circuit of the third embodiment, since the switch circuit SW1 turns ON and is electrically connected to the node PDRV, the node NDRV becomes the level of the bias potential VCC/2 in the same manner as the node PDRV. Accordingly, the output transistor N4 turns ON and an electric path is provided between the output terminal and ground potential node GND, so that a current which flowed thereinto through the pull-up resistor flows to the ground potential node GND through the output transistor N4. As a result, it is possible to prevent the current which flowed thereinto through the pull-up resistor from influencing upon the control of the rising edge rate.

At time t2, the control of the rising edge rate is completed. Since a current is pulled out toward the ground potential node by the current source 104, the node SUMP lowers to the level of the ground potential GND (FIG. 14(b)). Since the node SUMP lowers to the level of the ground potential GND, the node PDRV lowers to the level of the ground potential GND (FIG. 14(c)). Since the node NDRV is connected to the node PDRV, it lowers to the level of the ground potential GND (FIG. 14(c)). Since the node NDRV lowers to the level of the ground potential GND, the output transistor N4 turns OFF. Further, since the node PDRV lowers to the level of the ground potential GND, the output transistor P4 keeps ON state and the potential of the output node 101 keeps the level of the power supply potential VCC (FIG. 14(d)).

At time t3, both the enable signal P_EN and enable signal N_EN# become "L" (FIG. 14(a)). Since the enable signal P_EN becomes "L", the switch circuit SW1 turns OFF and the switch element N2 turns OFF while the amplifier 102 is in "inactive state", the clamp circuit CL1 is in "active state" and the switch element P3 turns ON. Since the switch circuit SW1 turns OFF, an electric path between the node PDRV and node NDRV is interrupted. Since the switch element N2 turns OFF, the current source 104 is interrupted in its current path. Since the clamp circuit CL1 is in "active state" to output the bias potential VCC/2, the potential of the node SUMP which has been the level of the ground potential GND is fixed to the bias potential VCC/2 (FIG. 14(b)). Further, the switch element P3 turns ON, the node PDRV becomes the level of the power supply potential VCC (FIG. 14(c)). Since the node PDRV becomes the level of the power supply potential VCC, the output transistor P4 turns OFF.

Since the enable signal N_EN# becomes "L", the switch element P2 turns ON and the amplifier 103 is in "active state" while the clamp circuit CL2 is in "inactive state". Since the switch element P2 turns ON, a constat current flows to the current source 105. A current flowing to the current source 105 is divided into a current for charging a capacitor element C2 and a current flowing to the input terminal DM of the amplifier 103. A value of current flowing to the current source 105 is determined by a resistance of a resistor element R2 and ON resistance of a PMOS forming the switch element P2. The amplifier 103 controls a conductive state of the output transistor N4 when it operates in the same manner as the first embodiment.

During a period from time t3 to time t4, both the node SUM and node NDRV fluctuate near the bias potential VCC/2 (FIG. 14(b), FIG. 14(c)). A current flowing from the output node 101 to the ground potential node is controlled by the amplifier 103 and capacitor element C1, so that a potential of the output node 101 lowers from the power supply potential VCC to the ground potential GND at a given edge rate (FIG. 14(d)).

At time t4, the control of the falling edge rate is completed. Since the electric charge from the current source 105 is accumulated in the capacitor element C1, the node SUM rises to the level of the power supply potential VCC (FIG. 14(b)). Since the node SUM becomes the level of the power supply potential VCC, the node NDRV becomes the level of the power supply potential VCC (FIG. 14(c)). Since the node NDRV becomes the level of the power supply potential VCC and the output transistor N4 keeps ON state, the output node 101 keeps the level of the ground potential GND (FIG. 14(d)). Subsequently, the foregoing operations are repeated.

As explained above, since the output buffer circuit of the third embodiment is provided with the switch circuit SW1 for connecting between the node PDRV and node NDRV during a period for controlling the rising edge rate (during a period that the amplifier 102 is in "active state"), it is possible to prevent the occurrence of distortion of the output waveform by a current flowing from the power supply potential node to the output node 101 through the pull-up resistor. Accordingly, the output buffer circuit of the third embodiment can fully satisfy an AC standard of a USB output buffer circuit, particularly a VCRS (crossover voltage) standard.

Fourth Preferred Embodiment

Figure 15:
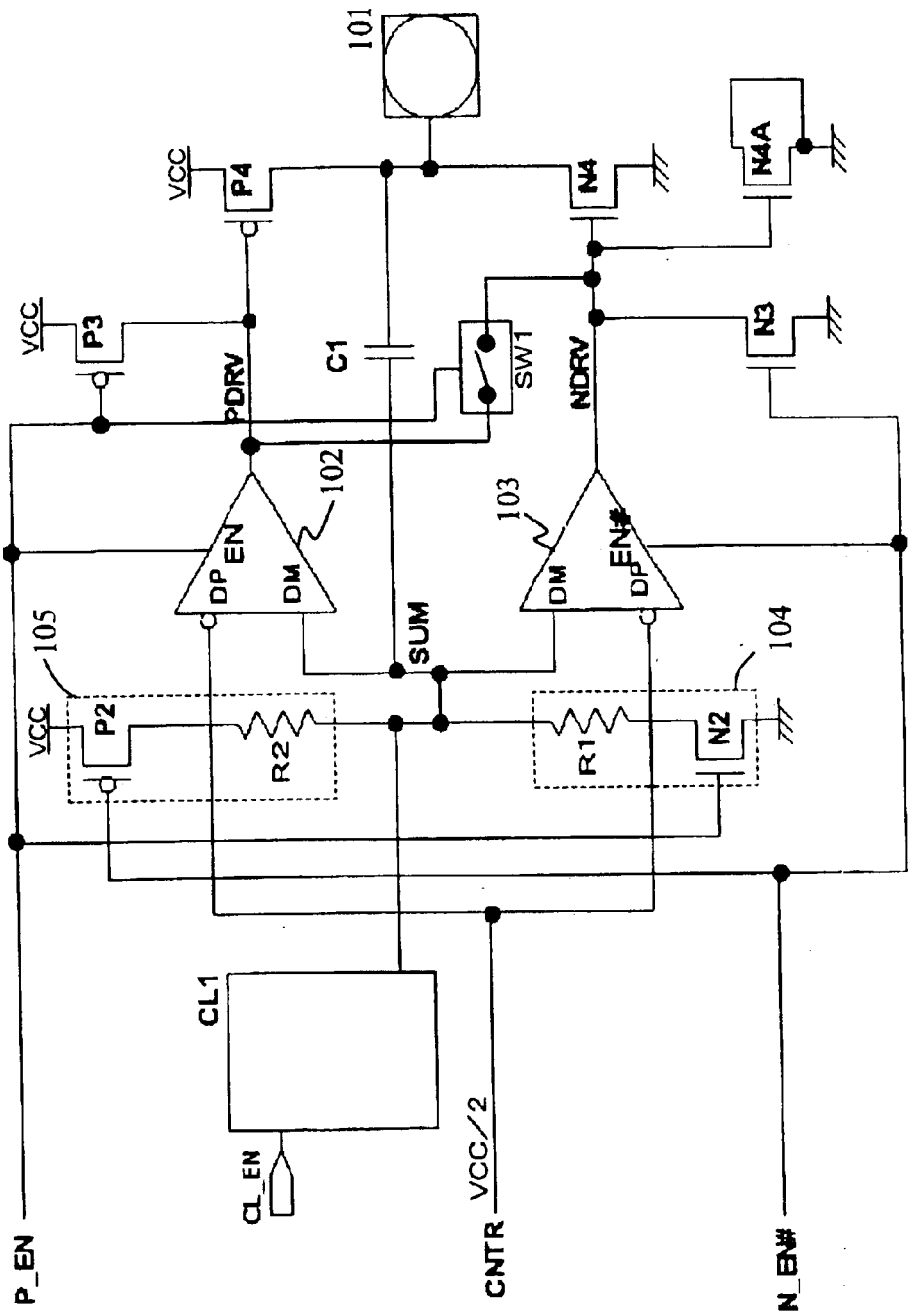
FIG. 15 is a circuit diagram showing the structure of an output buffer circuit according to a fourth embodiment of the invention.

An output buffer circuit according to a fourth embodiment of the invention is described. FIG. 15 is a circuit diagram showing the structure of the output buffer circuit according to the fourth embodiment of the invention. The output buffer circuit of the fourth embodiment is different from that of the second embodiment in respect of the provision of a switch circuit SW1. Other circuit configurations are the same as those of the second embodiment. The switch circuit SW1 is connected between a node PDRV and a node NDRV. The switch circuit SW1 connects between the node PDRV and node NDRV during a period that it controls the rising edge rate. More in detail, the switch circuit SW1 turns ON when an enable signal P_EN becomes "H" while it turns OFF when the enable signal P_EN becomes "L". The detailed circuit configuration of the switch circuit SW1 is the same as that shown in FIG. 13.

In the case where the output buffer circuit of the fourth embodiment is used as a low speed (LS) driver of a USB, a pull-up resistor is connected to the output node 101. A current flows from the power supply potential node into the output node 101 through the pull-up resistor. Supposing that the node NDRV is the level of the ground potential GND without providing the switch circuit SW1, an output transistor N4 turns OFF, thereby losing an electric path for letting off a current which flowed thereinto through the pull-up resistor. As a result, the current keeps flowing into the output node 101, which influences upon the control of the rising edge rate. However, according to the output buffer circuit of the fourth embodiment, since the switch circuit SW1 turns ON and the node NDRV is electrically connected to the node PDRV, the node NDRV becomes the level of a bias potential VCC/2 in the same manner as the node PDRV. Accordingly, the output transistor N4 turns ON and an electric path is provided between the output terminal and ground potential node GND, so that a current which flowed thereinto through the pull-up resistor flows to the ground potential node GND through the output transistor N4. As a result, it is possible to prevent the current which flowed thereinto through the pull-up resistor from influencing upon the control of the rising edge rate.

As explained above, since the output buffer circuit of the fourth embodiment is provided with the switch circuit SW1 for connecting between the node PDRV and node NDRV during a period for controlling the rising edge rate (during a period that the amplifier 102 is in "active state"), it is possible to prevent the occurrence of distortion of the output waveform by a current flowing from the power supply potential node into the output node 101 through the pull-up resistor.

As explained above in detail, since the typical output buffer circuit according to the invention has the first clamp circuit for supplying a given potential to the first node when the first control circuit is inactivated and stops the supply of the given potential when the first control circuit is activated, and a second clamp circuit for supplying a given potential to the second node when the second control circuit is inactivated, and stops the supply of the given potential when the second control circuit is activated, the output buffer circuit can start the control of the edge rate at a given timing without influencing upon the control of the edge rate.

What is claimed is:

1. A output buffer circuit comprising:
   a power supply potential node to which a power supply potential is supplied;
   a ground potential node to which a ground potential is supplied;
   an output node for outputting data;
   a first output transistor provided with a control electrode and connected between the power supply potential node and the output node;
   a second output transistor provided with a control electrode and connected between the ground potential node and the output node;
   a first node;
   a first current source connected between the first node and the ground potential node;
   a first capacitor element connected between the first node and the output node;
   a first control circuit connected between the first node and the control electrode of the first output transistor for controlling a conductive state of the first output transistor in response to a potential of the first node;
   a first clamp circuit for supplying a given potential to the first node when the first control circuit is inactivated and stopping the supply of the given potential when the first control circuit is activated;
   a second node;
   a second current source connected between the second node and the power supply potential node;
   a second capacitor element connected between the second node and the output node;
   a second control circuit connected between the second node and the control electrode of the second output transistor for controlling a conductive state of the second output transistor in response to a potential of the second node; and
   a second clamp circuit for supplying a given potential to the second node when the second control circuit is inactivated and stopping the supply of the given potential when the second control circuit is activated.

2. The output buffer circuit according to claim 1, wherein
   the first clamp circuit is made up of a P-channel transistor comprising a first electrode connected to the ground potential node, a second electrode connected to the first node, and a control electrode to which a first control signal is inputted;
   and an N-channel transistor comprises a first electrode connected to the power supply potential node, a second electrode connected to the first node and a control electrode to which an inverted signal of the first control signal is inputted; and wherein
   the second clamp circuit is made up of an N-channel transistor comprising a first electrode connected to the power supply potential node, a second electrode connected to the second node, and a control electrode to which a second control signal is inputted; and
   a P-channel transistor comprises a first electrode connected to the ground potential node, a second electrode connected to the second node, and a control electrode to which an inverted signal of the second control signal is inputted.

3. The output buffer circuit according to claim 2, wherein
   the first control circuit is made up of an amplifier comprising a first input terminal connected to the first node, a second input terminal to which a given potential is supplied, an output terminal connected to the control electrode of the first output transistor, and a control terminal to which the first control signal is supplied; and
   the second control circuit is made up of an amplifier comprising a first input terminal connected to the second node, a second input terminal to which a given potential is supplied, an output terminal connected to the control electrode of the second output transistor, and a control terminal to which the second control signal is supplied.

4. The output buffer circuit according to claim 3, wherein
   the first current source comprises a first resistor element and a first switch element connected to each other in series between the first node and the ground potential node; and
   the second current source is made up of a second resistor element and a second switch element which are serially connected to each other between the second node and the ground potential node.

5. The output buffer circuit according to claim 1, wherein
the first control circuit is activated in response to a first control signal of a first logical level and inactivated in response to the first control signal of a second logical level;
the first clamp circuit supplies a given potential to the first node in response to the first control signal of the second logical level, and stops the supply of the given potential in response to the first control signal of the first logical level;
the second control circuit is activated in response to a second control signal of a second logical level and inactivated in response to the second control signal of a first logical level;
the second clamp circuit supplies a given potential to the second node in response to the second control signal of the first logical level, and stops the supply of the given potential in response to the first control signal of the second logical level.

6. The output buffer circuit according to claim 4, wherein
the first current source is activated in response to the first control signal of the first logical level and inactivated in response to the first control signal of the second logical level; and
the second current source is activated in response to the second control signal of the second logical level and inactivated in response to the second control signal of the first logical level.

7. The output buffer circuit according to claim 1, further comprising a switch circuit connected between the control electrode of the first output transistor and the control electrode of the second output transistor.

8. The output buffer circuit according to claim 7, wherein the switch circuit turns ON when the first control circuit is activated.

9. The output buffer circuit according to claim 6, wherein
the first control circuit is activated in response to a first control signal of a first logical level and inactivated in response to the first control signal of a second logical level; and
the second control circuit is activated in response to a second control signal of a second logical level and inactivated in response to the second control signal of a first logical level.

10. The output buffer circuit according to claim 9, wherein
the first current source is activated in response to the first control signal of the first logical level and inactivated in response to the first control signal of the second logical level; and
the second current source is activated in response to the second control signal of the second logical level and inactivated in response to the second control signal of the first logical level.

11. An output buffer circuit comprising:
a power supply potential node to which a power supply potential is supplied;
a ground potential node to which a ground potential is supplied;
an output node for outputting data;
a first output transistor provided with a control electrode and connected between the power supply potential node and the output node;
a second output transistor provided with a control electrode and connected between the ground potential node and the output node;
a first node;
a capacitor element connected between the first node and the ground potential node;
a first current source connected between the first node and the ground potential node;
a first control circuit connected between the first node and the control electrode of the first output transistor for controlling a conductive state of the first output transistor in response to a potential of the first node;
a second current source connected between the first node and the power supply potential node;
a second control circuit connected between the first node and the control electrode of the second output transistor for controlling a conductive state of the second output transistor in response to a potential of the first node; and
a clamp circuit for supplying a given potential to the first node during a first given period before the first or second control circuit is activated, and stopping the supply of the given potential during a second given period when the first or second control circuit is activated upon elapse of the first given period.

12. The output buffer circuit according to claim 11, wherein
the clamp circuit is made up of an N-channel transistor comprising a first electrode connected to the power supply potential node, a second electrode connected to the first node, and a control electrode to which a control signal is inputted;
and a P-channel transistor comprising a first electrode connected to the ground potential node, a second electrode connected to the first node and a control electrode to which an inverted signal of the control signal is inputted.

13. The output buffer circuit according to claim 12, wherein
the first control circuit comprises a first input terminal connected to the first node, a second input terminal to which a given potential is supplied, an output terminal connected to the control electrode of the first output transistor, and a control terminal to which the first control signal is supplied; and
the second control circuit comprises a first input terminal connected to the second node, a second input terminal to which a given potential is supplied, an output terminal connected to the control electrode of the second output transistor, and a control terminal to which the second control signal is supplied.

14. The output buffer circuit according to claim 13, wherein
the first current source comprises a first resistor element and a first switch element which are serially connected to each other between the first node and the ground potential node; and
the second current source comprises of a second resistor element and a second switch element which are serially connected to each other between the first node and the power supply potential node.

15. The output buffer circuit according to claim 11, further comprising
a switch circuit connected between the control electrode of the first output transistor and the control electrode of the second output transistor.

16. The output buffer circuit according to claim 15, wherein
the switch circuit turns ON when the first control circuit is activated.

17. A output buffer circuit comprising:
a power supply potential node to which a power supply potential is supplied;
a ground potential node to which a ground potential is supplied;
an output node for outputting data;
a first conductive type first output transistor provided with a control electrode and connected between the power supply potential node and the output node;
a second conductive type second output transistor provided with a control electrode and connected between the ground potential node and the output node, and said second conductive type transistor is different from the first conductive type first transistor;
a first control circuit connected to the control terminal of the first output transistor for controlling a conductive state of the first output transistor;
a second control circuit connected to the control terminal of the second output transistor for controlling a conductive state of the second output transistor;
a switch element connected between the control electrode of the second output transistor and the ground potential node; and
a switch circuit connected between the control electrode of the first output transistor and the control electrode of the second output transistor.

18. The output buffer circuit according to claim 17, wherein
the switch circuit turns ON when the first control circuit is activated.

19. The output buffer circuit according to claim 18, wherein
the switch circuit turns ON when the switch element turns ON.

20. The output buffer circuit according to claim 17, wherein
the switch circuit is made up of a first conductive type first transistor comprising a first electrode connected to the control electrode of the first output transistor, a second electrode connected to the control electrode of the second output transistor, and a control electrode to which a control signal is inputted; and
a second conductive type transistor comprises a first electrode connected to the control electrode of the first output transistor, a second electrode connected to the control electrode of the second output transistor, and a control electrode to which an inverted signal of the control signal is inputted, and said second conductive type transistor is different from the first conductive type first transistor.

* * * * *

UNITED STATES PATENT AND TRADEMARK OFFICE
CERTIFICATE OF CORRECTION

PATENT NO. : 6,850,100 B2
DATED : February 1, 2005
INVENTOR(S) : Koji Takeshita

It is certified that error appears in the above-identified patent and that said Letters Patent is hereby corrected as shown below:

Column 19,
Line 37, "claim 6" should read -- claim 11 --.

Column 20,
Line 3, "ground potential" should read -- output --.

Columns 21 and 22,
Claims 17-20, has been cancelled.

Signed and Sealed this

Twenty-seventh Day of September, 2005

JON W. DUDAS
*Director of the United States Patent and Trademark Office*